US012532436B2

(12) United States Patent
Ren et al.

(10) Patent No.: US 12,532,436 B2
(45) Date of Patent: Jan. 20, 2026

(54) SYSTEM AND METHOD FOR COOLING DATA CENTER, AND COMPUTER ROOM

(71) Applicant: Beijing Youzhuju Network Technology Co., Ltd., Beijing (CN)

(72) Inventors: Yuanlin Ren, Beijing (CN); Shifeng Wang, Beijing (CN); Chenglong Gui, Beijing (CN); Zhichao Lv, Beijing (CN); Ruidong Wang, Beijing (CN); Ting Tian, Beijing (CN); Tangbo Jing, Beijing (CN); Jian Wang, Beijing (CN); Yulong Wang, Beijing (CN)

(73) Assignee: Beijing Youzhuju Network Technology Co., Ltd., Beijing (CN)

( * ) Notice: Subject to any disclaimer, the term of this patent is extended or adjusted under 35 U.S.C. 154(b) by 0 days.

(21) Appl. No.: 19/002,522

(22) Filed: Dec. 26, 2024

(65) Prior Publication Data
US 2025/0142786 A1 May 1, 2025

Related U.S. Application Data

(63) Continuation of application No. PCT/CN2023/108364, filed on Jul. 20, 2023.

(30) Foreign Application Priority Data

Jul. 25, 2022 (CN) .......................... 202210884483.0

(51) Int. Cl.
H05K 7/20 (2006.01)
(52) U.S. Cl.
CPC ....... *H05K 7/20736* (2013.01); *H05K 7/2039* (2013.01); *H05K 7/20781* (2013.01)

(58) Field of Classification Search
CPC ............. H05K 7/20736; H05K 7/2039; H05K 7/20781; H05K 7/2079; H05K 7/20745; H05K 7/20836
See application file for complete search history.

(56) References Cited

U.S. PATENT DOCUMENTS 7,355,852 B2 * 4/2008 Pfahnl .................... G06Q 20/20
174/15.1
10,201,116 B1 2/2019 Ross et al.
(Continued)

FOREIGN PATENT DOCUMENTS

CN 102217432 A 10/2011
CN 207201105 U 4/2018
(Continued)

OTHER PUBLICATIONS

International Patent Application No. PCT/CN2023/108364; Int'l Search Report; dated Oct. 24, 2023; 2 pages.
(Continued)

*Primary Examiner* — Adam B Dravininkas
(74) *Attorney, Agent, or Firm* — BakerHostetler

(57) ABSTRACT

A system and a method for cooling a data center, and a computer room are provided, where the system has a first channel and a second channel and the system includes: a stacking structure located between the first channel and the second channel, the stacking structure includes at least one electronic device and at least one surface cooler stacked with each other, each electronic device has a first air inlet and a first air outlet, each surface cooler has a second air inlet and a second air outlet, the first air outlet and the second air inlet are both oriented towards one side of the first channel, and the first air inlet and the second air outlet are both oriented towards one side of the second channel.

19 Claims, 15 Drawing Sheets

(56) References Cited

U.S. PATENT DOCUMENTS

| | | | |
|---|---|---|---|
| 10,912,229 B1* | 2/2021 | Gao | H05K 7/20818 |
| 2003/0147216 A1 | 8/2003 | Patel et al. | |
| 2008/0055846 A1* | 3/2008 | Clidaras | H05K 7/202 |
| | | | 361/679.41 |
| 2010/0147490 A1* | 6/2010 | Campbell | H05K 7/2079 |
| | | | 165/80.3 |
| 2011/0290448 A1* | 12/2011 | Campbell | H05K 7/20318 |
| | | | 165/181 |
| 2011/0292600 A1* | 12/2011 | Campbell | F24F 3/14 |
| | | | 62/119 |
| 2017/0013746 A1* | 1/2017 | Campbell | H05K 7/20736 |
| 2022/0003483 A1* | 1/2022 | Gao | H05K 7/20736 |
| 2022/0210953 A1 | 6/2022 | Gao | |

FOREIGN PATENT DOCUMENTS

| | | |
|---|---|---|
| CN | 209165653 U | 7/2019 |
| CN | 210694727 U | 6/2020 |
| CN | 214708495 U | 11/2021 |
| CN | 216532443 U | 5/2022 |
| EP | 2138759 A1 | 12/2009 |
| JP | 2012-096716 A | 5/2012 |
| WO | WO 2021/023923 A1 | 2/2021 |

OTHER PUBLICATIONS

European Patent Application No. 23845426.8; Extended Search Report; dated Oct. 6, 2025; 11 pages.

* cited by examiner

Collecting, by the second sensing assembly, the pressure values of the first channel and the second channel ⟋ 401

Obtaining, by the second control assembly, the pressure values of the first channel and the second channel, and reducing the exhaust capacity of the exhaust apparatus and/or the suction capacity of the suction device in response to that the pressure difference between the first channel and the second channel is greater than or equal to a preset pressure difference ⟋ 402

Fig. 18

SYSTEM AND METHOD FOR COOLING DATA CENTER, AND COMPUTER ROOM

The present application is a continuation of International Patent Application No. PCT/CN2023/108364, filed on Jul. 20, 2023, which claims priority to and benefit of Chinese Patent Application No. 202210884483.0 filed on Jul. 25, 2022, the disclosure of the above applications are incorporated herein by reference as part of the present application in their entireties.

TECHNICAL FIELD

Embodiments of the present disclosure relate to a system and a method for cooling a data center, and a computer room.

BACKGROUND

A data center is a specific device network for global collaboration and is used to transmit, accelerate, display, calculate, or store data information on the network infrastructure of the Internet. Thus, it has large energy consumption and heat dissipation. As such, it has become an important topic to improve the energy efficiency and control the power usage effectiveness (PUE) of data centers.

Among the numerous solutions for reducing the PUE of data centers, those using full cold plates can dissipate heat from all heat-emission components in the server. However, the cold plates in such solutions have complicated designs and difficulty in replacing parts and maintenance, making it not useful in actual use. In addition, many pipeline joints in the server also lead to a high risk of liquid leakage.

SUMMARY

An object of the present disclosure is to provide a system and a method for cooling a data center, and a computer room, to simplify the data center cooling scheme and reduce the difficulty of operation and maintenance and the risk of liquid leakage.

In a first aspect, the present disclosure provides a system for cooling a data center, the system for cooling the data center has a first channel and a second channel and the system for cooling the data center includes: a stacking structure located between the first channel and the second channel;
the stacking structure includes at least one electronic device and at least one surface cooler stacked with each other, each electronic device has a first air inlet and a first air outlet, each surface cooler has a second air inlet and a second air outlet, the first air outlet and the second air inlet are both oriented towards one side of the first channel, and the first air inlet and the second air outlet are both oriented towards one side of the second channel.

In the stacking structure of the system for cooling a data center provided in the present disclosure, the second air inlet of each surface cooler and the first air outlet of each electronic device are oriented towards one side of the first channel, and the second air outlet of each surface cooler and the first air inlet of each electronic device are oriented towards one side of the second channel. Based on this, the first air outlet of the electronic device can discharge hot air to the first channel, and the second air inlet of the surface cooler can introduce the hot air of the first channel into the surface cooler, so that the surface cooler cools the hot air, and then discharges the cool air to the second channel through the second air outlet of the surface cooler. Based on this, because the stacked structure is located between the adjacent first channel and the second channel, the first channel and the second channel can be isolated by the stacked structure, making the air flow in the first channel and the air flow in the second channel less probably to contact each other. Thus, the cool air discharged to the second channel through the second air outlet of the surface cooler basically does not contact with the hot air in the first channel, avoiding impact on the cooling capacity of the cool air in the second channel due to the hot air in the first channel. Based on this, the cool air in the first channel enters the electronic device through the first air inlet of the electronic device, so that the cool air absorbs the heat dissipated by internal components of the electronic device.

It can be seen that the system for cooling a data center provided in the present disclosure uses a surface cooler to cool the internal components of an electronic device in a recycled way without arranging separate cooling pipes on the surface of the internal components of the electronic device, and the surface cooler is used as a device for cooling the internal components of the electronic device, with cooling capacity close to relevant air-cooling systems, thereby reducing the PUE and operating costs of the data center. In addition, because at least one electronic device and at least one surface cooler are stacked together in a same stacked structure, the surface cooler or the electronic device can be serviced and maintained separately without special devices and operations, which is significantly better than that of an immersed system and a full cold plate system, thereby effectively reducing the difficulty of operation and maintenance of the cooling device for the internal components of an electronic device, reducing the internal pipeline joints of an electronic device (such as a server), and reducing the risk of liquid leakage during the cooling process of the electronic device. In addition, the at least one electronic device and the at least one surface cooler are stacked with each other in a same stacked structure, which reduces the difficulty in designing the cooling scheme of the data center. In the actual production and installation, the surface cooler and the electronic device are stacked with each other without special production conditions and installation and delivery processes, thereby simplifying the cooling scheme for the data center.

It can be seen from the above description that the system for cooling a data center provided in the present disclosure can effectively reduce the cooling cost of a data center from the three aspects including equipment investment, cooling capacity, and operation and maintenance, under the circumstance of simplifying the data center cooling scheme and reducing the difficulty of operation and maintenance and the risk of liquid leakage.

In a second aspect, the present disclosure further provides a data center computer room including the system for cooling a data center as described in the technical scheme of the present disclosure.

The data center computer room provided in the present disclosure has similar beneficial effects as those provided by the system for cooling a data center as described in the technical scheme of the present disclosure, so they are not described again here.

The present disclosure further provides a method for cooling a data center applied to the system for cooling a data center of the technical scheme of the present disclosure, the cooling of the data center has a plurality of cooling cycles, each of which includes:

discharging hot air to a first channel through a first air outlet of each electronic device;

introducing the hot air of the first channel into the surface cooler through a second air inlet of each surface cooler, so that the surface cooler cools the hot air;

discharging cool air to the second channel through a second air outlet of each surface cooler;

introducing the cool air from the second channel into the electronic device through a first air inlet of each electronic device, so that the cool air absorbs the heat dissipated by internal components of the electronic device.

The method for cooling a data center provided in the present disclosure has similar beneficial effects as those provided by the system for cooling a data center as described in the technical scheme of the present disclosure, so they are not described again here.

BRIEF DESCRIPTION OF DRAWINGS

The drawings illustrated herein are intended to provide a further understanding of the present disclosure and form a part of the present disclosure, and the illustrative embodiments of the present disclosure and descriptions thereof are used for interpreting the present disclosure and do not constitute an undue limitation of the present disclosure. In the figures:

FIG. 18 shows a cooperation process flowchart of a second control assembly and a second sensing assembly according to an exemplary embodiment of the present disclosure.

DETAILED DESCRIPTION

Figure 1:
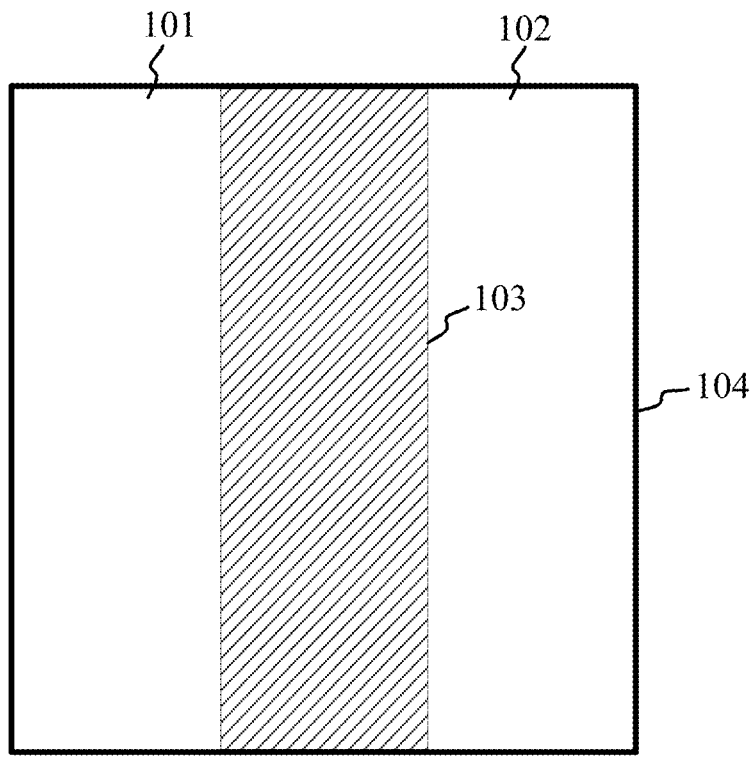
FIG. 1 shows a basic schematic plan view of a system for cooling a data center provided in an exemplary embodiment of the present disclosure.

In order to further illustrate the technical problems, technical solutions and beneficial effects solved by the present disclosure, the present disclosure is further described in detail below with reference to the accompanying drawings and embodiments. It should be understood that specific embodiments described herein are only used to explain the present disclosure and are not intended to limit the present disclosure thereto.

It should be noted that when a component is referred to as "fixed to" or "provided on" another component, it can be arranged on that component directly or indirectly. When a component is referred to as "connected" to another component, it can be either directly connected to that component or indirectly connected to that component.

In addition, the terms "first" and "second" are used for descriptive purposes only and should not be construed as indicating or implying relative importance or implying the number of technical features indicated. Thus, features defined as the "first" and "second" may explicitly or implicitly include one or more of these features. In the description of the present disclosure, "a plurality of" means two or more, unless otherwise specifically defined. The word "several" means one or more than one, unless otherwise specifically defined.

In the description of the present disclosure, it may be understood that the terms "upper", "lower", "front", "rear", "left", "right", and the like indicate the orientation or positional relationship based on the orientation or positional relationship shown in the drawings, and are only for describing the present disclosure and simplify the description, and do not indicate or imply that the device or element referred to must have a particular orientation or be constructed and operated in a particular orientation, and therefore cannot be construed as limiting the present disclosure.

In the description of the present disclosure, it is noted that, unless otherwise specifically defined, the terms "mounted", "connected", and "linked" shall be construed broadly. For example, they may be fixedly, detachably, or integrally connected; they may be mechanically or electrically connected; they may be directly or indirectly connected through an intermediate medium; or they may be the internal connection of two elements or the interaction relationship between two elements. For those of ordinary skill in the art, specific meanings of the foregoing terms in the present disclosure may be understood according to specific situations.

Power usage efficiency (PUE), an indicator of the energy efficiency of a data center, is the ratio of all energy consumed by a data center to the energy used by the Internet (Internet Technology, IT) loads, and is inversely proportional to the data center infrastructure efficiency (DCIE). The baseline value of PUE is 2. The closer the baseline value of PUE is to 1, the better the energy efficiency level of the data center is.

Among the related technologies, the immersed liquid cooling scheme and the full cold plate scheme can be used to cool a data center. The immersed liquid cooling scheme has not been widely used in data center cooling. When the immersed liquid cooling scheme is used to cool a data center, network devices of the data center may be immersed in a cooling liquid. However, the cooling liquid is expensive and required complicated operation and maintenance, resulting in relatively low overall benefit of the immersed liquid cooling scheme. When the full cold plate scheme is used to cool the data center, the cooling fan in the network device is eliminated and replaced with a cold plate structure for cooling all the heating parts in the server. However, the biggest problem is that the cold plate has a complicated structure and has high cost. When individual components of the network device need to be replaced, the cold plate structure needs to be removed from the network device and the internal components of the network device need to be replaced, resulting in complex operation and maintenance of the data center. In addition, when all the heating parts of the network device are cooled by the cold plate structure, the cold plate structure is not only complex, but also has a large number of joints, leading to a high risk of liquid leakage.

Because of the above problem, the exemplary embodiments of the present disclosure provide a system and a method for cooling a data center, where the system for cooling a data center according to the exemplary embodiments of the present disclosure adopts a surface cooling technology for data center cooling. It uses a surface cooler to cool the hot air flow discharged by an electronic device, and then discharges the cool air into the air inlet side of the electronic device, so that the cool air can enter the electronic device through the air inlet of the electronic device, absorbs the heat dissipated by internal components of the electronic device, and cools the electronic device, which can effectively simplify the cooling scheme of the data center, reduce the difficulty of operation and maintenance, and reduce the risk of liquid leakage. The system and method for cooling a data center according to the exemplary embodiments of the present disclosure are described below with reference to the accompanying drawings.

FIG. 1 shows a basic schematic plan view of a system for cooling a data center provided in an exemplary embodiment of the present disclosure. As shown in FIG. 1, the system 100 for cooling a data center according to an exemplary embodiment of the present disclosure has a first channel 101 and a second channel 102. The system 100 for cooling a data center according to the exemplary embodiments of the present disclosure may include: a stacking structure 103, where the stacking structure 103 is located between the first channel 101 and the second channel 102, so that the stacking structure 103 can isolate the first channel 101 and the second channel 102.

Figure 2:
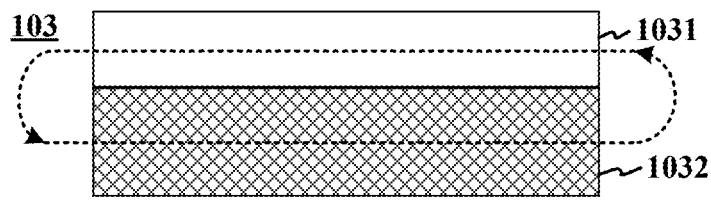
FIG. 2 shows a schematic diagram of a basic structure of a stacking structure according to an exemplary embodiment of the present disclosure.

FIG. 2 shows a schematic diagram of the basic structure of a stacking structure according to an exemplary embodiment of the present disclosure. As shown in FIG. 2, the stacking structure 103 according to an exemplary embodiment of the present disclosure includes at least one electronic device 1031 and at least one surface cooler 1032 arranged in a stack. In this mode, the electronic device 1031 and the surface cooler 1032 are assembled in an easy way without special production assembly conditions and delivery processes, thereby effectively reducing the assembly difficulty of the stacking structure 103. It should be understood that electronic device 1031 may not be limited to various network devices such as switches, storage servers, computing servers, graphics processing units (GPU) servers, and the like.

As shown in FIG. 2, in the same stacking structure 103 according to the exemplary embodiment of the present disclosure, each electronic device 1031 has a first air inlet and a first air outlet. The external airflow enters the electronic device 1031 through the first air inlet and is discharged from the electronic device 1031 through the first air outlet. Each surface cooler 1032 has a second air inlet and a second air outlet, the external airflow enters a surface cooler 1032 through the second air inlet and is discharged from the surface cooler 1032 through the second air outlet.

In a practical application, as shown in FIG. 1 and FIG. 2, the first air inlet and the first air outlet are symmetrically arranged on the two end faces of the electronic device 1031 along a preset direction, and the second air inlet and the second air outlet are symmetrically arranged on the two end faces of the surface cooler 1032 along a preset direction. Furthermore, the first air inlet of each electronic device 1031 and the second air outlet of each surface cooler 1032 are oriented towards one side of the second channel 102, and the first air outlet of each electronic device 1031 and the second air inlet of each surface cooler 1032 are oriented towards one side of the first channel 101.

In a specific implementation, as shown in FIG. 1 and FIG. 2, because the first air outlet of each electronic device 1031 and the second air inlet of each surface cooler 1032 are oriented towards one side of the first channel 101, and the first air inlet of each electronic device 1031 and the second air outlet of each surface cooler 1032 are oriented towards one side of the second channel 102, so that the heat dissipated by internal components of the electronic device 1031 can be discharged into the first channel 101 through the first air outlet, and the hot in the first channel 101 is then introduced into the surface cooler 1032 through the second air inlet of the surface cooler 1032, which is cooled in the mode of surface heat exchange, and then the cool air is discharged to the second channel 102 through the second air outlet of the surface cooler 1032. Based on this, because the stacking structure 103 is located between the adjacent first channel 101 and second channel 102, the first channel 101 and the second channel 102 can be isolated by the stacking structure 103, making the air flow in the first channel 101 and the air flow in the second channel 102 less probably to contact each other. Thus, the cool air discharged to the second channel 102 through the second air outlet of the surface cooler 1032 basically does not contact with the hot air in the first channel 101, thus avoiding impact on the cooling capacity of the cool air in the second channel 102 by the hot air in the first channel 101. Based on this, the cool air in the first channel enters the electronic device 1031 through the first air inlet of the electronic device 1031, so that the cool air absorbs the heat dissipated by internal components of the electronic device 1031.

It can be seen that, as shown in FIG. 1 and FIG. 2, the system 100 for cooling a data center provided in the exemplary embodiments of the present disclosure uses the surface cooler 1032 to achieve a circulated cooling of the internal components of the electronic device 1031. This cooling mode essentially cools the electronic device 1031 using ambient air flow and provides inner circulated cooling of cool and hot air through air flow, so it does not need to separately arrange cooling pipes on the surface of the internal components of the electronic device 1031. The surface cooler 1032 can be used as a cooling device for an internal component of the electronic device 1031, with cooling capacity similar to that of the related technical air-cooling system.

For example, a data center can use air conditioning to cool the data center on the basis of the full cold plate scheme, and the compressor inside the air conditioner needs additional power supply, resulting in a higher PUE of the data center. Instead, in the data center cooling system according to the exemplary embodiment of the present disclosure, the cooling mode of internal circulation of cold and hot air is carried out through air flow, and the surface cooler 1032 cools the air flow to cool the electronic device 1031, thereby reducing the PUE of the data center, the unit energy consumption, and the total cost of ownership (TCO).

In related technologies, when the whole liquid cooling method is used to cool the electronic device, the main heating parts of the electronic device, such as the central processing unit and the graphic processor, or the secondary heat-emission components, such as memory modules, each are provided with liquid cooling pipes, resulting in complex internal liquid cooling pipes and the risk of liquid leakage. Thus, the whole liquid cooling scheme has complicated design and high installation and operation and maintenance costs. As shown in FIG. 1 and FIG. 2, in the system 100 for cooling a data center according to the exemplary embodiments of the present disclosure, the liquid-cooling pipeline of the secondary heat-emission components in the electronic device 1031 can be eliminated, and the airflow is cooled by the surface cooler 1032 stacked with the electronic device 1031, so that the cool air is provided to the inside of the electronic device, so that the cool air absorbs the heat dissipated by the secondary heat-emission components. Based on this, the system 100 for cooling a data center according to the exemplary embodiments of the present disclosure can reduce the internal pipeline joints of an electronic device such as a server, and reduce the risk of liquid leakage in the cooling process of electronic device. Moreover, because the at least one electronic device 1031 and the at least one surface cooler 1032 are stacked with each other in a same stacked structure 103, there is no need to design and provide liquid cooling lines specifically for the secondary heat-emission components, thereby effectively simplifying the design difficulty and complexity of the data center cooling system. Moreover, because the at least one electronic device 1031 and the at least one surface cooler 1032 are stacked with each other, the surface cooler 1032 and the electronic device 1031 are independent of each other, such that both the electronic device 1031 and surface cooler 1032 can be operated, serviced and maintained separately without affecting each other and without special equipment and operation, which is significantly better than the immersed system and the full cold plate system, and can effectively reduce the difficulty of operation and maintenance of the cooling equipment of the internal components of the electronic device 1031.

In addition, in the system for cooling the data center according to the exemplary embodiment of the present disclosure, the at least one electronic device 1031 and at least one surface cooler 1032 are stacked with each other in the same stacking structure 103. Thus, in actual production, the electronic device 1031 and the surface cooler 1032 can be produced separately, and can be simply stacked and installed together when assembling or delivering without special production conditions and installation and delivery process, which can effectively simplify the cooling scheme of the data center.

It can be seen from the description above that the system for cooling a data center provided in the present disclosure can effectively reduce the cooling cost of a data center from the three aspects including equipment investment, operation and maintenance, under the circumstance of simplifying the data center cooling scheme and reducing the difficulty of operation and maintenance and the risk of liquid leakage.

In an optional implementation, as shown in FIG. 2, the number of electronic devices 1031 and the number of surface coolers 1032 according to the exemplary embodiments of the present disclosure can be designed according to actual needs, where there may be one or more electronic devices included in the stacking structure. Similarly, there may be one or more surface coolers included in the stacking structure.

When there are a plurality of electronic devices contained in the stacking structure, there may be one or more surface coolers. When there are a plurality of surface coolers, the plurality of surface coolers are stacked together to form a surface cooling assembly, which is then stacked with a plurality of electronic devices, or the plurality of surface coolers are spaced with each other and located at different parts of the stacking structure.

For example, when one surface cooler is provided, or a plurality of surface coolers are provided in the form of a surface cooling assembly, the surface cooler or the surface cooling assembly is stacked with a plurality of electronic devices. The surface cooler may be located in the middle of the plurality of electronic devices, or at the bottom of the plurality of electronic devices, or on top of the plurality of electronic devices. When a surface cooler is located in the middle of a plurality of stacked electronic devices, the middle is defined in a broad sense, instead of a narrow sense.

The following provides an example of a surface cooler located in the middle of the plurality of electronic devices. It should be understood that the exemplary embodiments of the present disclosure disclose an example where a surface cooler is located in the middle of a plurality of electronic devices. However, the exemplary embodiments of the present disclosure do not exclude the implementations where the surface cooler is replaced by a surface cooling assembly to provide relevant functions.

Figure 3:
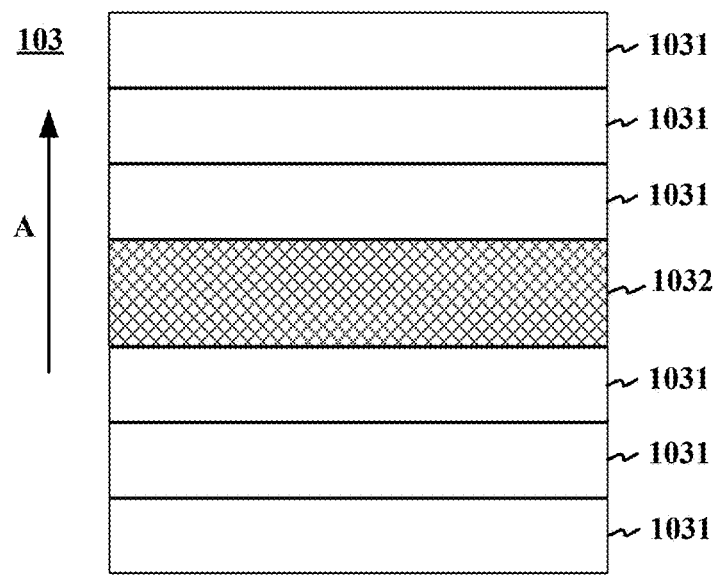
FIG. 3 to FIG. 6 show schematic diagrams of four structures of a stacking structure according to an exemplary embodiment of the present disclosure.

FIG. 3 shows a schematic diagram of a structure of a stacking structure according to an exemplary embodiment of the present disclosure. As shown in FIG. 3, a stacking structure 103 according to the exemplary embodiments of the present disclosure includes six electronic devices 1031, and the surface cooler 1032 is arranged between the third electronic device and the fourth electronic device in the direction shown by the first arrow A. In this case, the surface cooler is located right in the middle of the six electronic devices stacked with each other. The surface cooler 1032 can symmetrically cool the three electronic devices 1031 below it and the three electronic devices 1031 above it, so as to ensure the temperature uniformity of the electronic devices 1031 contained in the entire stacking structure 103.

Figure 4:
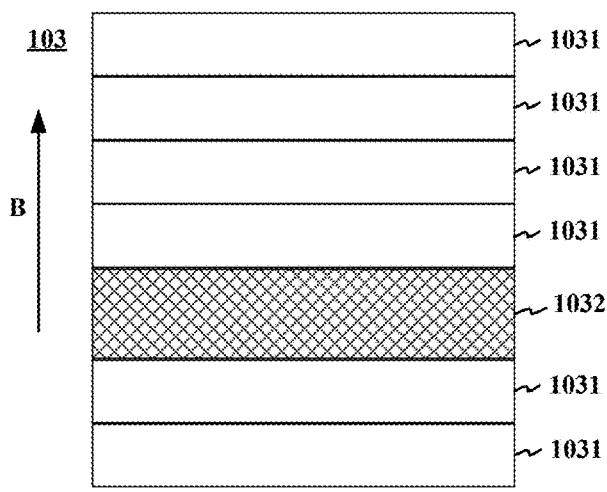

FIG. 4 shows a schematic diagram of another structure of a stacking structure according to an exemplary embodiment of the present disclosure. As shown in FIG. 4, a stacking structure 103 according to the exemplary embodiments of the present disclosure includes six electronic devices 1031, and the surface cooler 1032 is arranged between the second electronic device and the third electronic device in the direction shown by the second arrow B. In this case, the surface cooler 1032 is located at the lower part of the six stacked electronic devices 1031, and mainly cools the electronic devices 1031 near the bottom of the stacking structure 103. Based on this, when among a plurality of electronic devices 1031 contained in the stacking structure 103, the first electronic device to the third electronic device are more likely to generate heat or have poor heat dissipation than the fourth to sixth electronic devices, the surface cooler 1032 can be used to mainly cool the first electronic device to the third electronic device. It should be understood that the surface cooler 1032 can also cool the fourth to sixth electronic devices, but has weaker cooling capability to the fourth electronic device to sixth electronic device compared to the first electronic device to the third electronic device.

Figure 5:
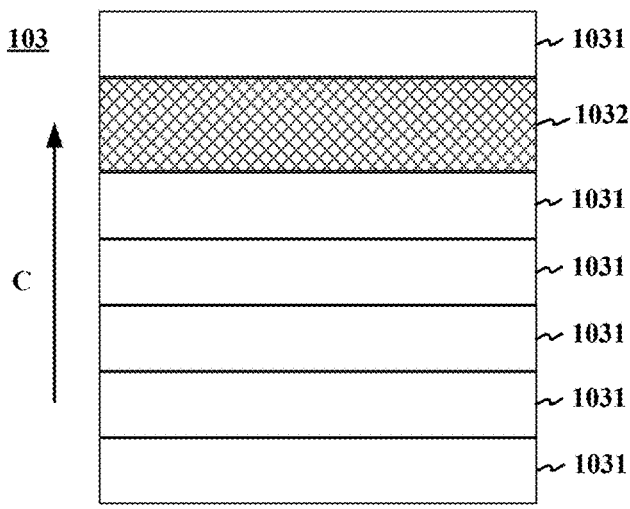

FIG. 5 shows a schematic diagram of yet another structure of a stacking structure according to an exemplary embodiment of the present disclosure. As shown in FIG. 5, a stacking structure 103 according to the exemplary embodiments of the present disclosure includes six electronic devices 1031, and the surface cooler 1032 is arranged between the fifth electronic device and the sixth electronic device in the direction shown by the third arrow C. In this case, the surface cooler 1032 is located at the upper part of the six stacked electronic devices, and mainly cools the electronic devices 1031 near the top of the stacking structure 103. Based on this, when among a plurality of electronic devices contained in the stacking structure 103, the fourth electronic device to the sixth electronic device are more likely to generate heat or have poor heat dissipation than the first to third electronic devices, the surface cooler 1032 can be used to mainly cool the fourth electronic device to the sixth electronic device. It should be understood that the surface cooler 1032 can also cool the first to third electronic devices, but has weaker cooling capability to the first electronic device to third electronic device compared to the fourth electronic device to the sixth electronic device.

When a plurality of electronic devices and a plurality of surface coolers are contained in the stacking structure, the plurality of surface coolers can be stacked together with the plurality of electronic devices at a spacing. For example, some surface coolers are stacked and combined into a surface cooling assembly, while the other surface coolers and surface cooling assemblies are stacked with a plurality of stacking structures at a spacing.

Figure 6:
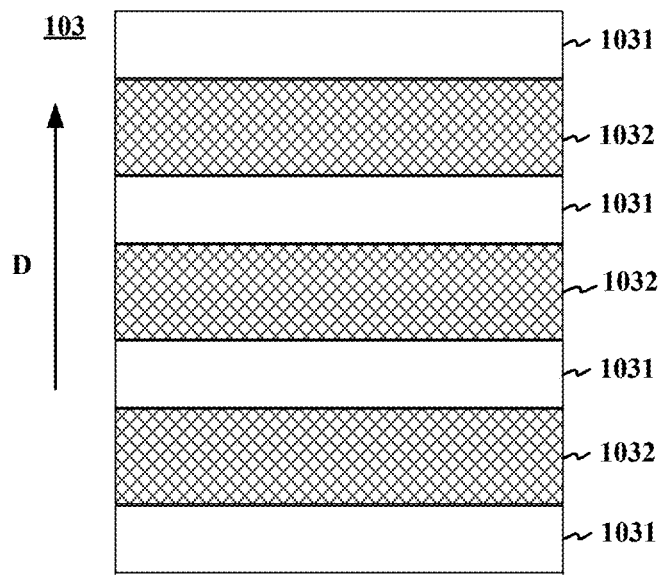

FIG. 6 shows a schematic diagram of yet another structure of a stacking structure according to an exemplary embodiment of the present disclosure. As shown in FIG. 6, the stacking structure 103 according to an exemplary embodiment of the present disclosure includes four electronic devices 1031 and three surface coolers 1032, where the electronic devices and the surface coolers are arranged alternately in the direction of the fourth arrow D. In this case, the individual surface coolers 1032 can be used to ensure uniform temperature distribution throughout the stacking structure and avoid local heating problems.

In an optional implementation, the number of the stacking structures according to the exemplary embodiments of the present disclosure may be one or more, and the stacking structures may be divided into at least one group. The first channel and the second channel are alternately distributed along a first preset direction, and each group of stacking structures is located between adjacent first channel and second channel. The same group of stacking structures may include at least one stacking structure. If the same group of stacking structure includes a plurality of stacking structures, the plurality of stacking structures are alternately distributed in a second preset direction. It should be understood that the first preset direction and the second preset direction may be set perpendicular to each other, or according to the actual situation. In addition, the first preset direction can be the positive direction of the first preset direction or the negative direction of the first preset direction.

In practical application, as shown in FIG. 1, the system 100 for cooling a data center according to the exemplary embodiments of the present disclosure further includes an enclosed housing 104. The at least one group of stacking structures 103 is located within the enclosed housing 104. The first channel 101 and the second channel 102 are alternately distributed in the enclosed housing 104 along the first preset direction. As shown in FIG. 1 and FIG. 2, in the process of internal circulated cooling with cool and hot air of the electronic devices 1031, the stacking structure 103 located inside the enclosed housing 104 can prevent the external heat from entering the inside of the enclosed housing 104 and affecting the cooling effect, and also prevent cool air inside the enclosed housing 104 from leaking in the process of the circulated cooling with cool and hot air, thereby further reducing the PUE. In addition, it can reduce environmental noise, wind currents, and electromagnetic radiation in the Internet data center (IDC), thereby improving the operation and maintenance environment. It should be understood that the number of first channels and the number of second channels in the exemplary embodiments of the present disclosure is related to the number of groups of the stacking structure, as illustrated by the example below.

Figure 7:
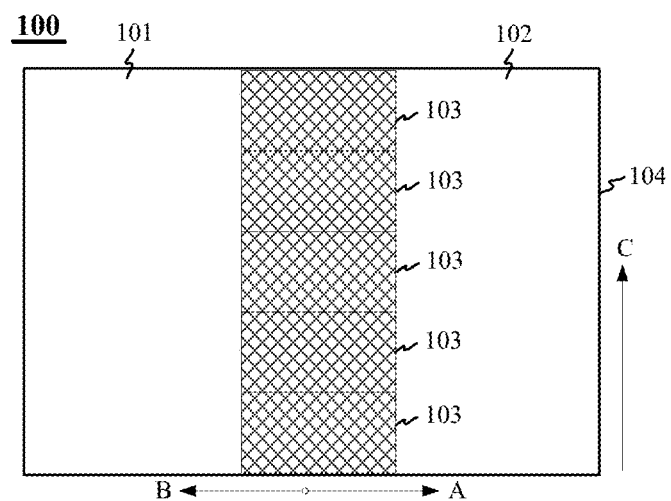
FIG. 7 to FIG. 9 show three schematic plan views of a system for cooling a data center provided in an exemplary embodiment of the present disclosure.

FIG. 7 shows a schematic plan view of a system for cooling a data center provided in an exemplary embodiment of the present disclosure. As shown in FIG. 7, the system 100 for cooling a data center according to the exemplary embodiments of the present disclosure has one first channel 101 and one second channel 102, and the first channel 101 and the second channel 102 are distributed along a first preset direction. The system 100 for cooling a data center includes one group of stacking structure that is located between the first 101 and the second channel 102, and the group of stacking structures, the first channel 101 and the second channel 102 are all located in an enclosed housing 104. In this case, no matter that the first channel 101 and the second channel 102 are distributed along the positive direction A of the first preset direction or the negative direction B of the first preset direction, the number of the first channel 101 and the number of the second channel 102 are one. The group of stacking structures includes five stacking structures 103, and the five stacking structures 103 are stacked along a second preset direction C. It should be understood that although FIG. 7 only shows the case with five stacking structures 103, it is possible that the number of the stacking structures 103 is less than five, even only one stacking structure 103, or more than five. These cases that are not excluded in the embodiments can referred to the description of FIG. 7.

When there are two or more groups stacking structures, the number of the first channels and the number of the second channels are also related to the distribution of the first channels and the second channels in the first preset direction.

Figure 8:
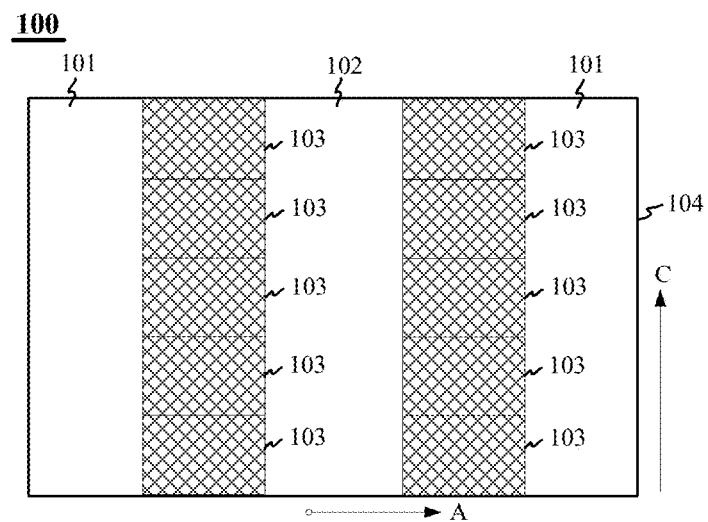

For example, the first channel and the second channel are distributed in the positive direction of the first preset direction, and the number of first channels is greater than the number of second channels. Assuming that the number of first channels is N, the number of second channels is N−1, and N is an integer greater than or equal to 2. FIG. 8 shows another schematic plan view of a system for cooling a data center provided in an exemplary embodiment of the present disclosure. As shown in FIG. 8, the system 100 for cooling a data center according to the exemplary embodiments of the present disclosure has two first channels 101 and one second channel 102. The two first channels 101 and the second channel 102 are distributed alternately along the positive direction A of the first preset direction. Two groups of stacking structures 103 are distributed along the first preset direction in the enclosed housing 104, each group of stacking structures 103 includes five stacking structures 103 stacked along the second preset direction C, and the two groups of stacking structures 103 share one second channel 102.

Figure 9:
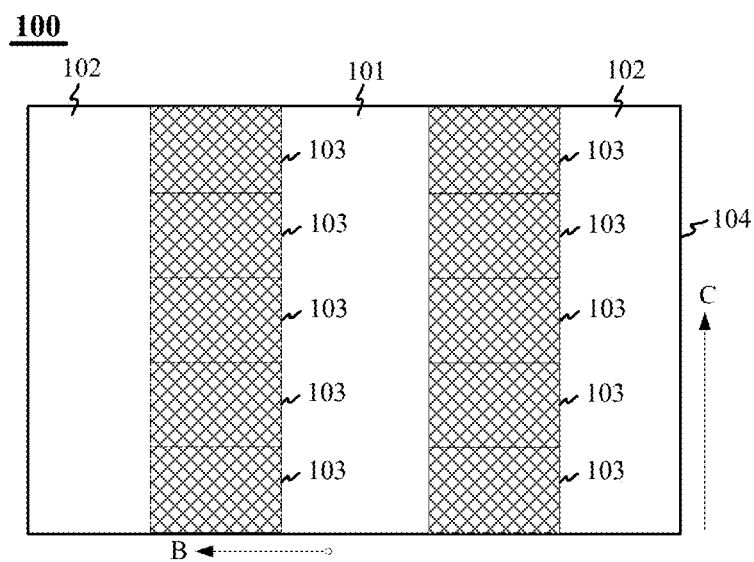

For example, the first channel and second channel are distributed along the negative direction of the preset direction, and the number of first channels is less than the number of second channels. Assuming that the number of first channels is M, the number of second channels is M+1, and M is an integer greater than or equal to 1. FIG. 9 shows yet another schematic plan view of a system for cooling a data center provided in an exemplary embodiment of the present disclosure. As shown in FIG. 9, the system 100 for cooling a data center according to the exemplary embodiments of the present disclosure has one first channel 101 and two second channels 102. The first channel 101 and the two second channels 102 are distributed alternately along the negative direction B of the first preset direction. Two groups of stacking structures 103 are distributed along the first preset direction in the enclosed housing 104, each group of stacking structures 103 includes five stacking structures 103 stacked along the second preset direction C, and the two groups of stacking structures 103 share one first channel 101.

Although FIG. 8 and FIG. 9 show only the case where there are two groups of stacking structures and each group of stacking structures contains five stacking structures 103, it is possible that there are less than or more than two groups of stacking structures 103, and it is also possible that each group of stacking structures contains less than five stacking structures, for example even one stacking structure 103 or more than five stacking structures 103.

As shown in FIG. 7 to FIG. 9, the enclosed housing 104 according to the exemplary embodiments of the present disclosure may be a computer cabinet in a broad sense, and any container that can accommodate the stacking structure 103 may be referred to as the computer cabinet. For example, the enclosed housing 104 is a common computer cabinet or a computer room in a data center. When the enclosed housing 104 is a computer cabinet, the stacking structure 103 in any one computer cabinet, the stacking structures 103 in a plurality of computer cabinets, or the stacking structures 103 in all computer cabinets in a data center computer room may be set as the structure of the data center cooling system in the exemplary embodiments of the present disclosure. In addition, the enclosed housing 104 of the exemplary embodiments of the present disclosure not only needs to be provided with various threading holes, but also needs to be provided with through holes for passing the pipeline that transports cooling fluid.

Figure 10A:
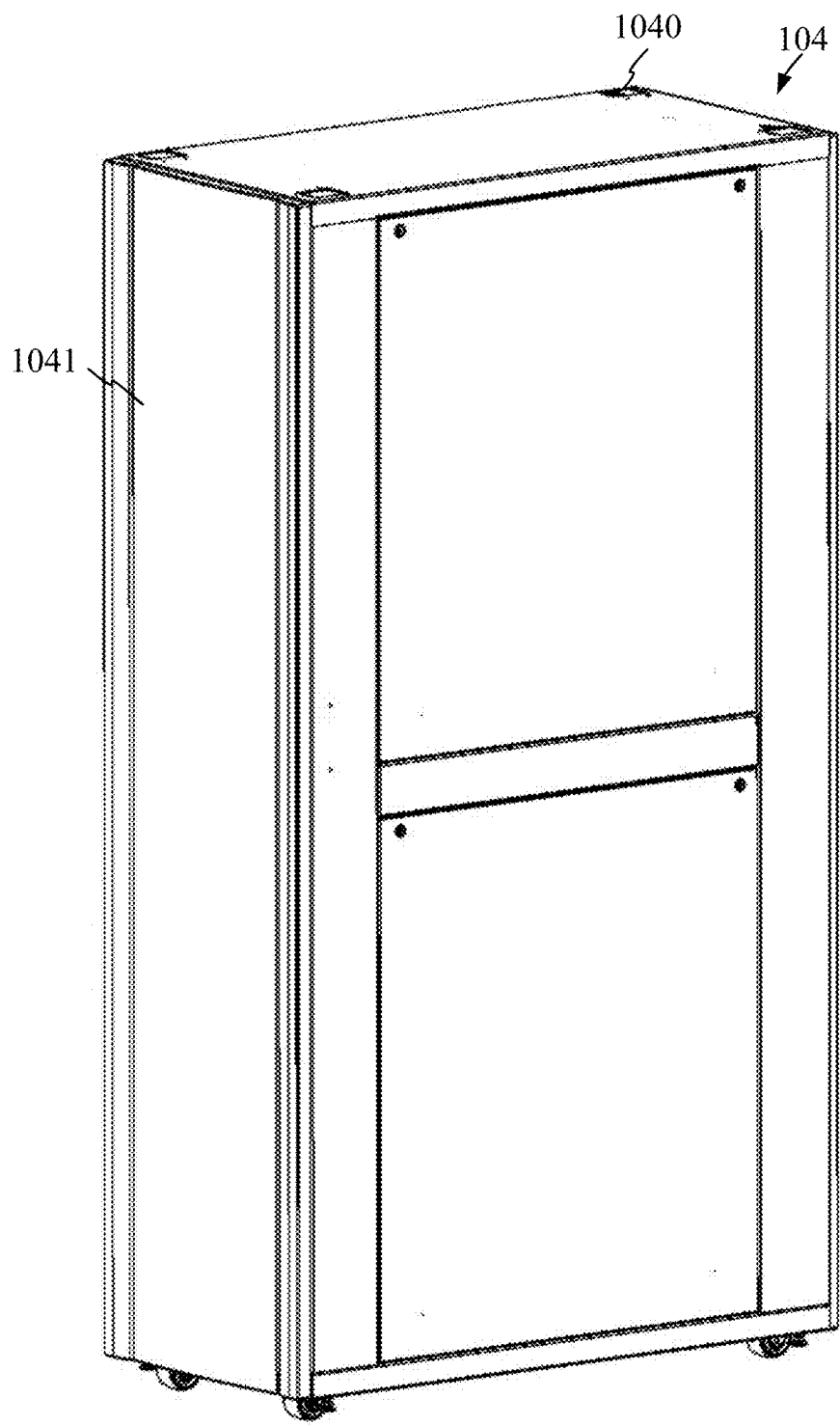
FIG. 10A and FIG. 10B show three-dimensional structural diagram of a computer cabinet from two perspectives according to an exemplary embodiment of the present disclosure.
Figure 10B:
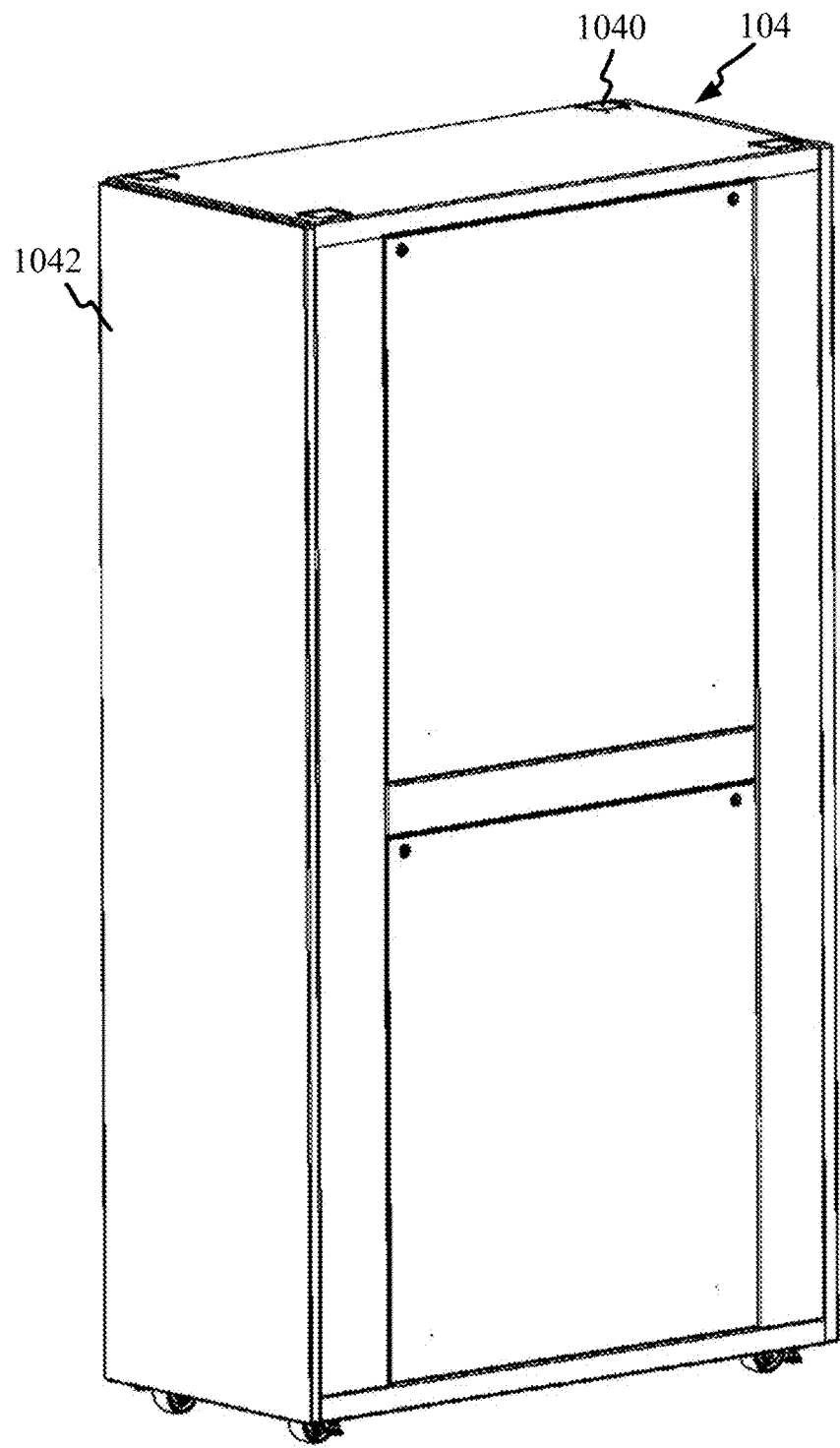

FIG. 10A and FIG. 10B show three-dimensional structural diagram of an enclosed housing from two perspectives according to an exemplary embodiment of the present disclosure. As shown in FIG. 10A and FIG. 10B, the enclosed housing 104 is a cuboid computer cabinet, at the top of which is provided with openings 1040, such as a pipeline hole for passing through the pipeline or a through hole (the pipeline hole and the through hole are not distinguished in FIG. 10A and FIG. 10B and both of them are indicated by the opening 1040). In order to achieve sealing, the opening 1040 is sealed with a sealing structure, which can be a rubber seal, a sealing belt, or the like, to ensure the overall sealing in the computer cabinet and improve the cooling effect. In addition, the cuboid computer cabinet has a sealed front door 1041 and a sealed rear door 1042 to reduce environmental noise, wind currents, and electromagnetic radiation in the Internet data center (IDC), thereby improving the operation and maintenance environment. In the case that the airtightness is not taken into account, the front and rear of the computer cabinet can be designed with mesh doors or without doors. In addition, a power management unit located in first channel near the rear end of the computer cabinet is further provided in the computer cabinet to manage the power of electronic device.

Figure 11A:
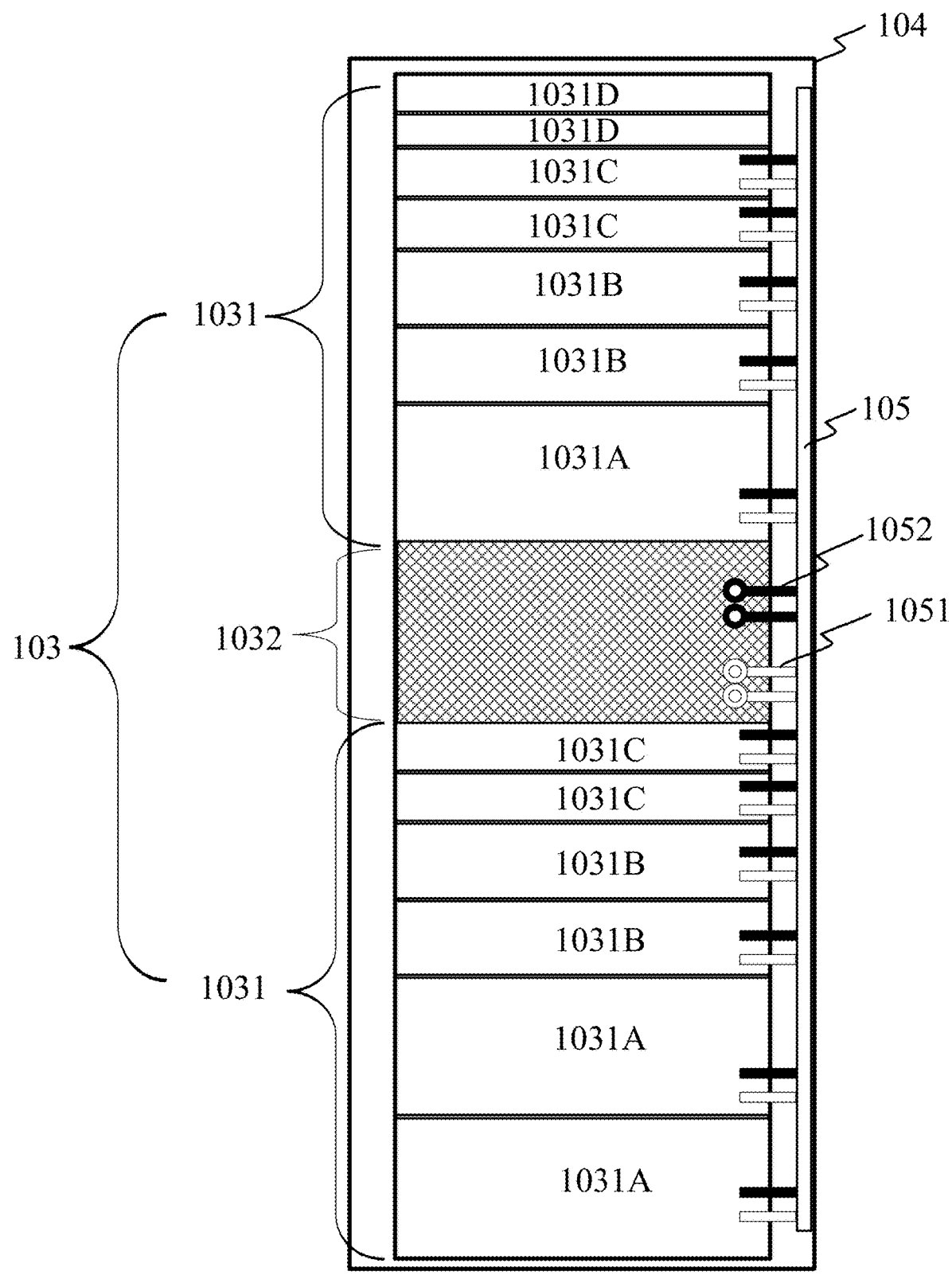
FIG. 11A shows a schematic back view of a system for cooling a data center according to an exemplary embodiment of the present disclosure.
Figure 11B:
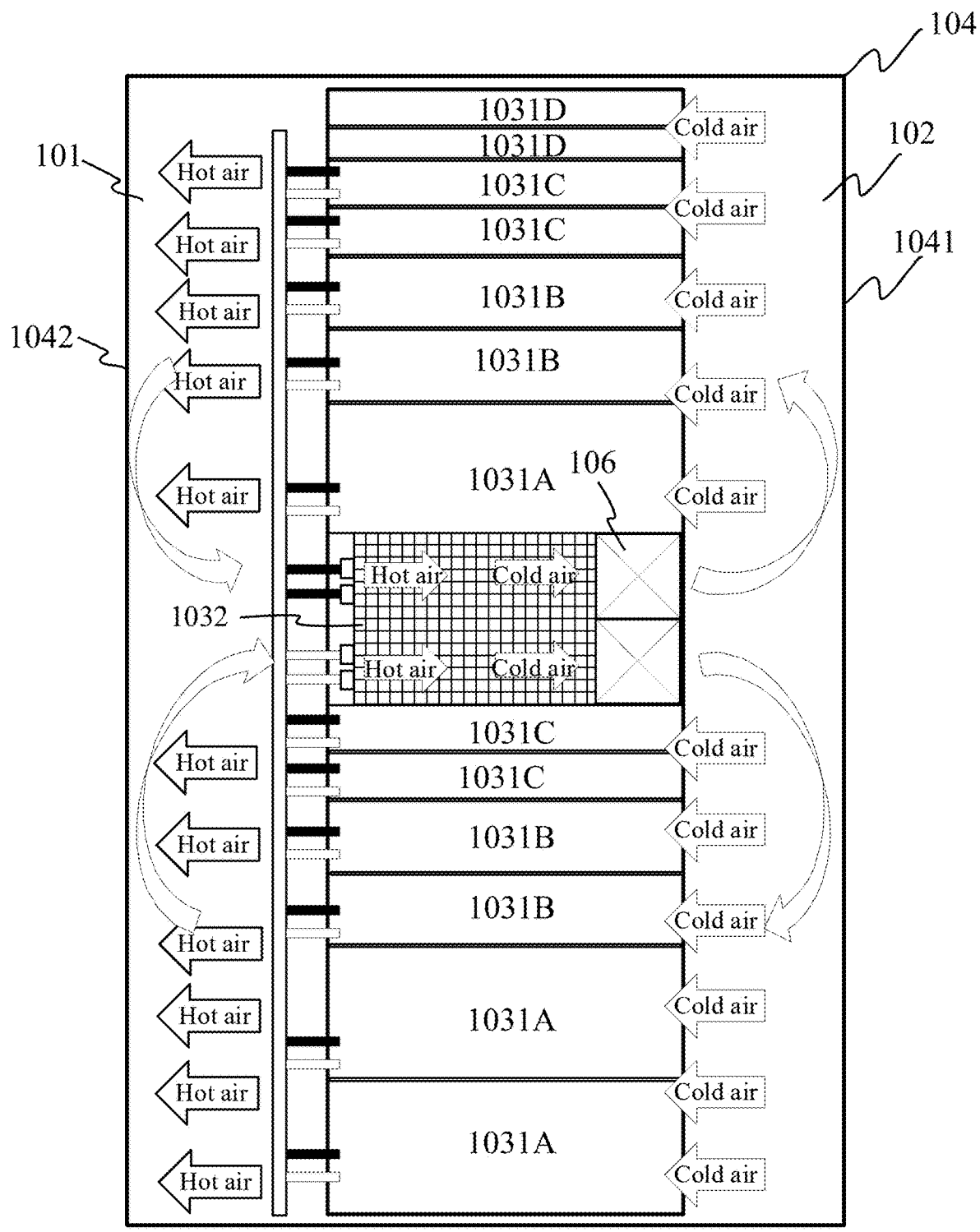
FIG. 11B shows a schematic side view of a system for cooling a data center according to an exemplary embodiment of the present disclosure.
Figure 11C:
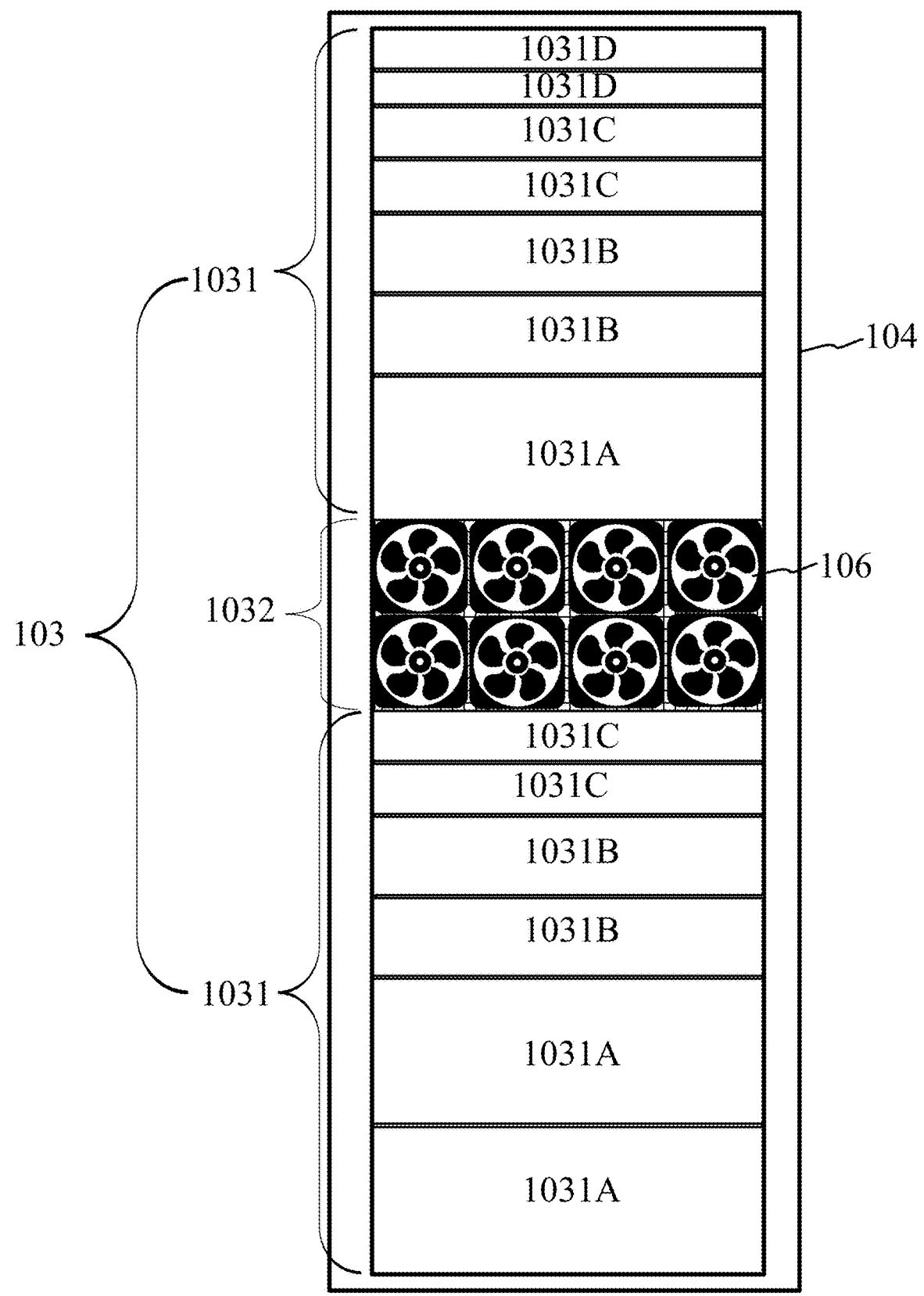
FIG. 11C shows a schematic front view of a system for cooling a data center according to an exemplary embodiment of the present disclosure.

In an optional implementation, FIG. 11A shows a schematic back view of the system for cooling a data center according to the exemplary embodiments of the present disclosure, FIG. 11B shows a schematic side view of the system for cooling a data center according to the exemplary embodiments of the present disclosure, and FIG. 11C shows a schematic front view of a system for cooling a data center according to the exemplary embodiments of the present disclosure. In the scheme shown in FIG. 11A to FIG. 11C, the first air inlet and the second air outlet are located on the same side, and the first air outlet and the second air inlet are located on the same side. For example, as shown in FIG. 11A and FIG. 11B, the first air outlet and the second air inlet are oriented towards the same first channel 101, and the first air inlet and the second air outlet are oriented towards the same second channel 102. The first air inlet and the second air outlet are positioned at the front end of the electronic device 1031 or the front end of the surface cooler 1032, and the first air outlet and the second air inlet are located at the rear end of the electronic device 1031 or the rear end of the surface cooler 1032.

As shown in FIG. 10A, FIG. 11A to FIG. 11C, when the stacking structure 103 according to the exemplary embodiments of the present disclosure is located in an enclosed housing 104, the first channel 101 is located at the rear ends of the electronic device 1031 and the surface cooler 1032 and close to the sealed rear cabinet door 1042. As shown in FIG. 10B, FIG. 11A to FIG. 11C, the second channel 102 is positioned at the rear ends of the electronic equipment 1031 and the surface cooler 1032 and close to the sealed front cabinet door 1041.

The electronic device in the stacking structure of the exemplary embodiments of the present disclosure may be cooled by a cooling fluid, such as a liquid-cooling mode, or may be cooled by air cooling, or may be cooled by both. Exemplarily, the stacking structure may be provided with different electronic devices, such as network devices, according to actual needs. For example, it may be provided with standard air-cooling switches, compute-type air-cooling and/or cold-plate servers, storage-type air-cooling and/or cold-plate servers, and GPU-type air-cooling and/or cold-plate servers. For example, for the scheme shown in FIG. 11A to FIG. 11C, the stacking structure 103 includes from bottom to up: two GPU-type air-cooling/cold-plate servers 1031A, two storage-type air-cooling/cold-plate servers 1031B, two compute-type air-cooling/cold-plate servers 1031C, a surface cooler 1032, one GPU-type air-cooling/ cold-plate server 1031A, two storage-type air-cooling/cold-plate servers 1031B, two compute-type air-cooling/cold plate servers 1031C, and two air-cooling switches 1031D. It should be understood that "air-cooling/cold plate" indicate a mode that provides both cooling methods, but it does not exclude only the air cooling mode or only the liquid cooling mode.

The surface cooler and the electronic device according to the exemplary embodiments of the present disclosure may be both cooled by using a cooling fluid. Based on this, as shown in FIG. 11A, the system for cooling a data center according to the exemplary embodiments of the present disclosure further includes: a transmission pipeline 105, the transmission pipeline 105 includes a first transmission pipeline and a second transmission pipeline (FIG. 11A and FIG. 11B do not distinguish the first transmission pipeline from the second transmission pipeline, the first transmission pipeline and the second transmission pipeline are both represented in the form of the transmission pipeline 105). Each surface cooler 1032 has a cooler housing and a cooling pipeline that is located in the cooler housing, the cooling pipeline is communicated with the first transmission pipeline and the second transmission pipeline respectively, and the second air inlet and the second air outlet are provided on the cooler housing.

In a specific implementation, as shown in FIG. 11A and FIG. 11B, the first transmission pipeline introduces cooling fluid to the cooling fluid pipeline. The hot air in the first channel 101 enters the internal space of the cooler housing through the second air inlet. In this case, the cooling fluid in the cooling pipe can cool the hot air entering the internal space of the cooler housing, so that the temperature of the hot air gradually decreases, becomes cool air, and is discharged into the second channel 102 from the second air outlet. It should be understood that each surface cooler 1032 in the exemplary embodiments of the present disclosure may be a liquid-cooling surface cooler, and the cooling liquid transported by the first transmission pipeline and the second transmission pipeline may be water, or other cooling liquids that can achieve cooling, which is not limited in the present disclosure.

Figure 19:
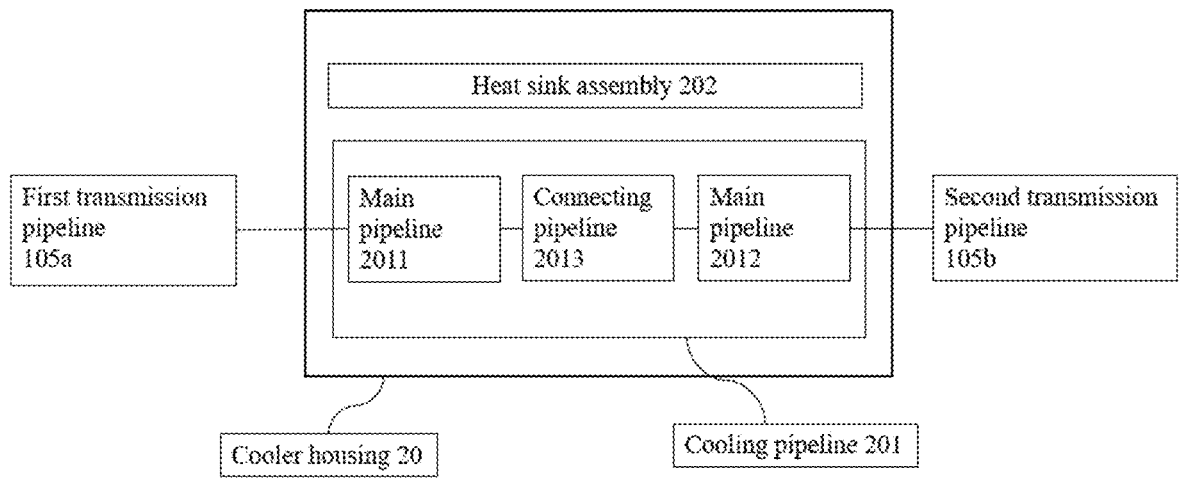
FIG. 19 shows a schematic diagram of a surface cooler according to an exemplary embodiment of the present disclosure.
Figure 20:
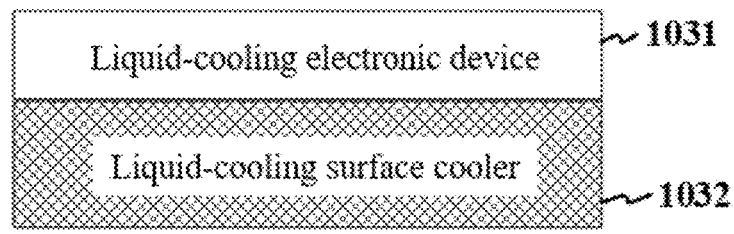
FIG. 20 shows a schematic diagram of a surface cooler and an electronic device according to an exemplary embodiment of the present disclosure.
Figure 21:
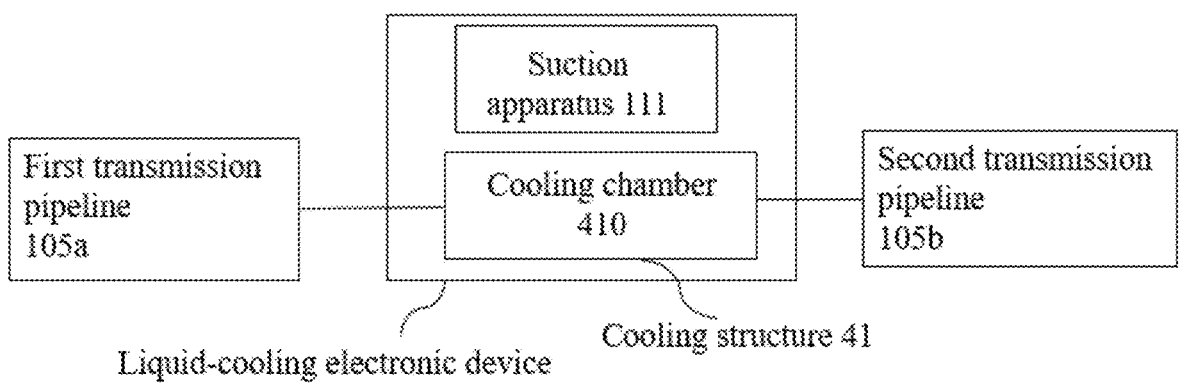
FIG. 21 shows a schematic diagram of an electronic device according to an exemplary embodiment of the present disclosure.

FIG. 19 shows a schematic diagram of a surface cooler according to an exemplary embodiment of the present disclosure. FIG. 20 shows a schematic diagram of a surface cooler and an electronic device according to an exemplary embodiment of the present disclosure. FIG. 21 shows a schematic diagram of an electronic device according to an exemplary embodiment of the present disclosure. Each electronic device 1031 of the exemplary embodiments of the present disclosure may be a liquid-cooling electronic device, as shown in FIG. 20 and FIG. 21. Based on this, each electronic device 1031 can have a cooling structure 41 that has a cooling chamber 410. The cooling chamber 410 is communicated with the first transmission pipeline 105a and the second transmission pipeline 105b respectively. In this case, as shown in FIG. 19, the cooling pipeline 201 of each surface cooler 1032 is communicated with the first transmission pipeline 105a and the second transmission pipeline 105b, and the cooling chamber 410 of the electronic device 1031 is communicated with the first transmission pipeline 105a and the second transmission pipeline 105b. Based on this, when the first transmission pipeline 105a introduces a cooling fluid into the cooling pipeline 201 of the surface cooler 1032, the cooling fluid is also introduced into the cooling chamber 410 of the electronic device 1031, the heat dissipated by the main heat-emission components of the electronic device 1031 is absorbed simultaneously by utilizing the cooling fluid. When the second transmission pipeline 105b outputs the cooling fluid in the cooling pipeline 201 of the surface cooler 1032, it also outputs the cooling fluid in the cooling chamber 410 of the electronic device 1031.

Figure 12:
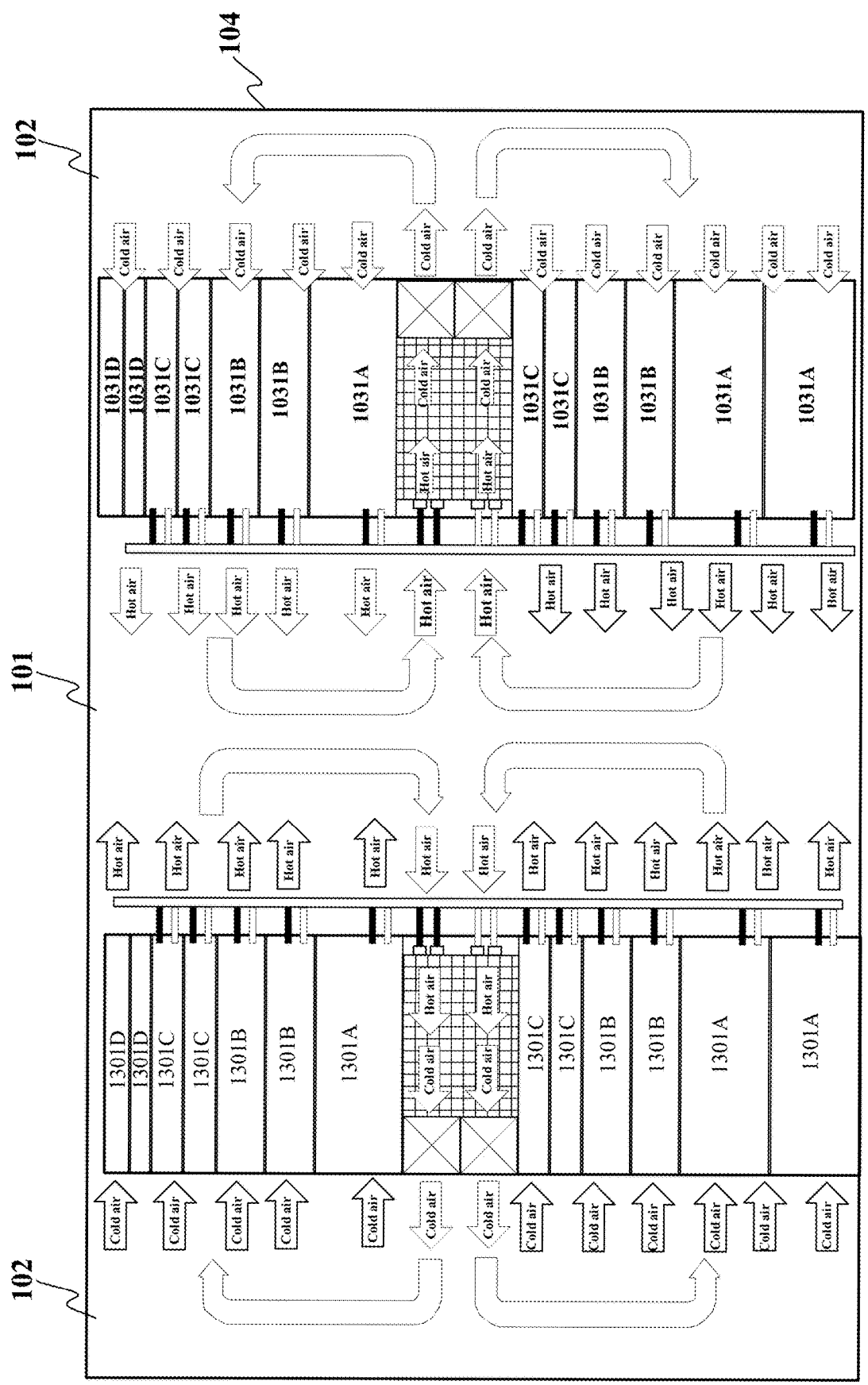
FIG. 12 shows another schematic side view of a system for cooling a data center according to an exemplary embodiment of the present disclosure.

FIG. 12 shows another schematic side view of a system for cooling a data center according to an exemplary embodiment of the present disclosure. The difference between the data center cooling system shown in FIG. 12 and the data center cooling system shown in FIG. 11A to FIG. 11C lies in that the computer cabinet has two stacking structures therein with one first channel 101 between the two stacking structures. The plan layout of the data center cooling system shown in FIG. 12 can be referred to FIG. 8.

In a specific implementation, as shown in FIG. 12, the two groups of stacking structures are located in the enclosed housing 104, and the heat inside the electronic devices contained in the two groups of stacking structures is discharged into the first channel 101 between the two stacking structures from the first air outlet in the form of hot air, so that the two stacking structures can share one first channel 101. In addition, the hot air from the electronic device contained in the two stacking structures disturbs each other in the first channel 101, which increases the probability that the hot air enters the surface coolers contained in the two stacking structures, thereby improving the speed of internal circulation of cold and hot air, and improving the cooling capacity of the surface cooler.

With reference to the schematic side view shown in FIG. 11B, the following is to describe the cooling principle of a system for cooling a data center, in the case that the network device is an electronic device and the surface cooler is a liquid-cooling surface cooler is. It should be understood that the cooling principle of the system for cooling a data center shown in FIG. 12 can be referred to FIG. 11B, which is not described in detail below.

The exemplary embodiments of the present disclosure may dissipate heat from the main heating devices, such as CPUs and GPUs, in a network device through a liquid-cooling surface cooler. The cold air in the second channel 102 is absorbed through the air inlet at a front end of the network device, that is, the air inlet at the front end of the system, so as to cool and dissipate the remaining heat-emission components (located inside the network device), and then the hot air is discharged to the first channel 101 through the air outlet at the rear end of the network device. The hot air then enters the inside of the surface cooler 1032 through the air inlet at the rear end of the surface cooler 1032 and is cooled by liquid cooling. The cooled air is discharged into the second channel 102 from the front end of the surface cooler 1032, that is, the front end of the system, to form an internal cold and hot air circulation system in the closed system, and dissipate heat from the network device in the closed system. Based on this, the system for cooling a data center in the exemplary embodiments of the present disclosure only needs to provide a cooling water system on the computer room side, and does not require an additional cooling system, thereby reducing PUE and the construction cost of the computer room.

For example, as shown in FIG. 11B, the system for cooling a data center of the exemplary embodiments of the present disclosure further includes at least one exhaust apparatus 106, each exhaust apparatus 106 is arranged at the second air outlet of the corresponding surface cooler 1032 to use the exhaust apparatus 106 to accelerate the discharging of cool air from the corresponding surface cooler 1032 and improve the speed of the internal air flow in the electronic device 1031, thereby providing rapid cooling. The exhaust apparatus 106 includes one or more exhaust fans or other components that can exhaust air. The arrangement of the exhaust fan or other exhaust components can be determined according to the actual needs.

For example, at least one electronic device according to the exemplary embodiments of the present disclosure has a suction apparatus, which comprises a suction component that can draw cool air from the second channel into the electronic device, such as a suction fan. When the electronic device is provided with the suction apparatus, the cool air in the second channel can enter the electronic device more quickly to cool the heat-emission components inside the electronic device.

For example, the system for cooling a data center according to the exemplary embodiments of the present disclosure includes at least one exhaust apparatus, while the electronic device is provided with a suction apparatus (for example, the suction apparatus 111 shown in FIG. 21), and the suction apparatus and the exhaust apparatus constitute an engine that drives the circulation of cold and hot air in the closed system, thereby ensuring that the pressure difference in the first channel is close to that in the second channel, so as to stably cool the electronic device.

In a practical application, the cooling structure according to the exemplary embodiments of the present disclosure has a first fluid inlet and a first fluid outlet respectively communicated with a cooling chamber, and the first fluid inlet and the first fluid outlet can be designed according to the actual situation. The cooler housing has a second fluid inlet and a second fluid outlet respectively communicated with the cooling pipeline, and the second fluid inlet and the second fluid outlet can be designed according to the actual situation.

The electronic device according to the exemplary embodiments of the present disclosure may have one first fluid inlet and one first fluid outlet for example, and the surface cooler may have a pair of second fluid inlets and a pair of second fluid outlets, but the above number may also be variously designed in other embodiments. As may be seen from FIG. 11A and FIG. 11B, for example, the electronic device 1031 according to the exemplary embodiments of the present disclosure has one first fluid inlet and one first fluid outlet, and the surface cooler 1032 has a pair of second fluid inlets and a pair of second fluid outlets.

The first fluid inlet and the second fluid inlet according to the exemplary embodiments of the present disclosure are both communicated with the first transmission pipeline to ensure that the first transmission pipeline can simultaneously introduce the cooling fluid to the cooling chamber in the electronic device and the cooling pipeline of the surface cooler. The first fluid outlet and the second fluid outlet are both communicated to the second transmission pipeline, so as to ensure that the cooling fluid in the cooling chamber of the electronic device and the cooling pipeline of the surface cooler can be output simultaneously by utilizing the second transmission pipeline.

Figure 13A:
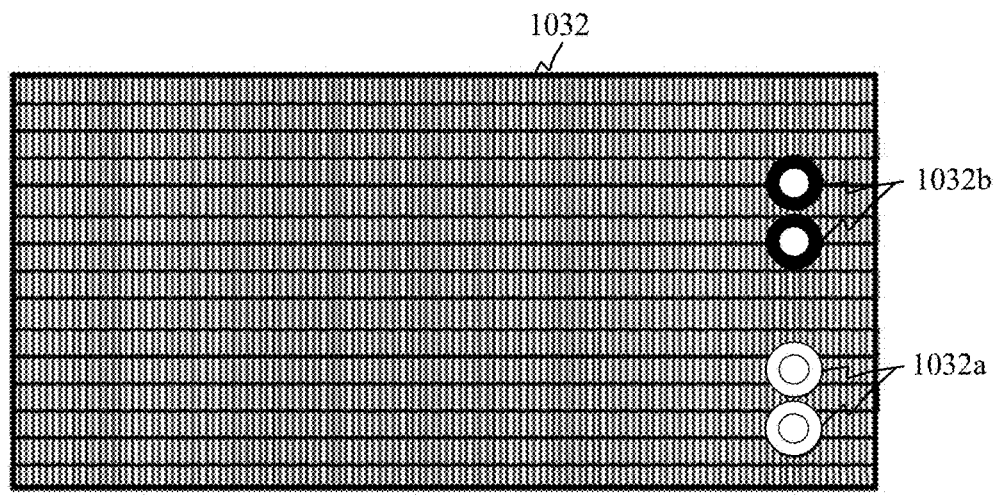
FIG. 13A shows a schematic back view of a surface cooler according to an exemplary embodiment of the present disclosure.
Figure 13B:
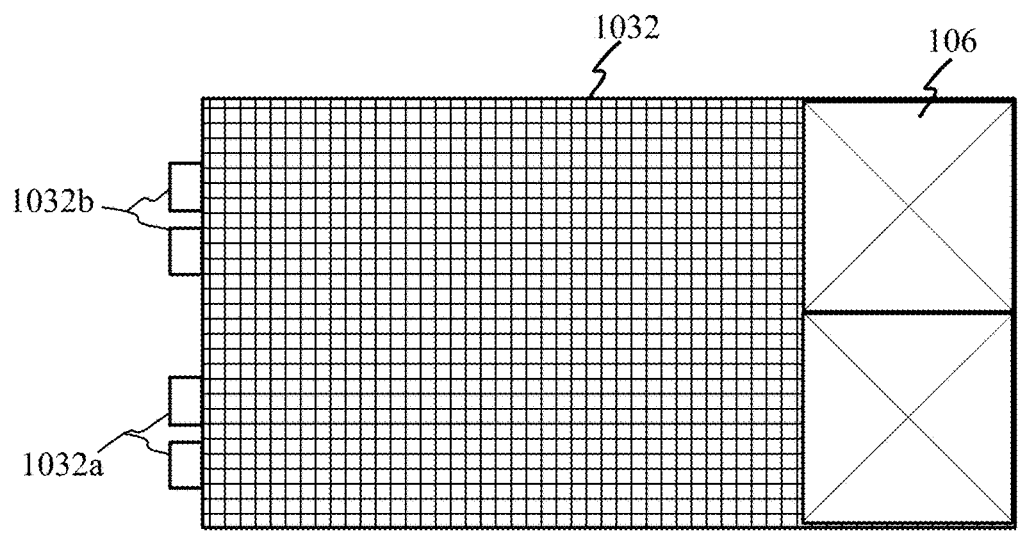
FIG. 13B shows a schematic side view of a surface cooler according to an exemplary embodiment of the present disclosure.
Figure 13C:
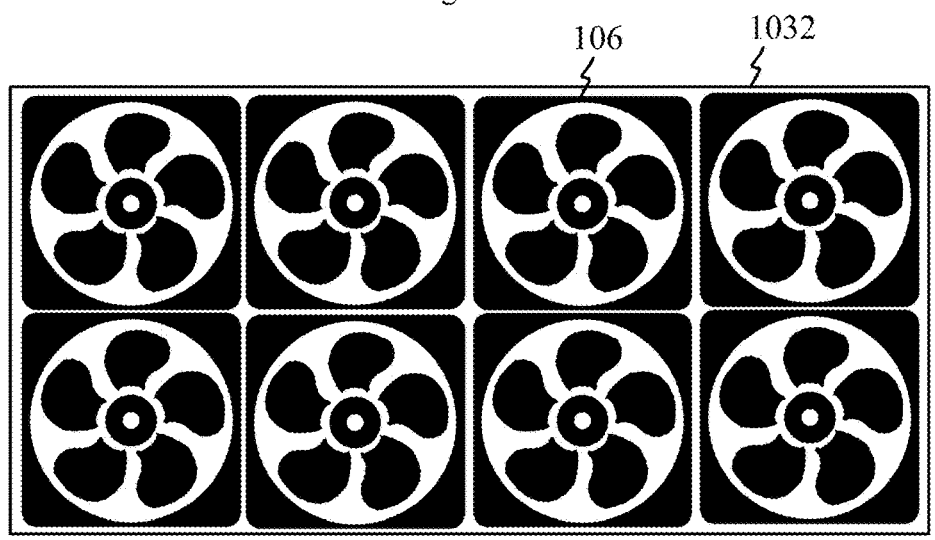
FIG. 13C shows a schematic front view of a surface cooler according to an exemplary embodiment of the present disclosure.

FIG. 13A shows a schematic rear view of a surface cooler according to the exemplary embodiments of the present disclosure. FIG. 13B shows a schematic side view of a surface cooler 1032 according to the exemplary embodiments of the present disclosure, and FIG. 13C shows a schematic front view of a surface cooler 1032 according to the exemplary embodiments of the present disclosure. As shown in FIG. 13A to FIG. 13C, the second air inlet of the surface cooler 1032 according to the exemplary embodiments of the present disclosure is provided at the rear end of the surface cooler 1032, and the rear end of the surface cooler 1032 is provided with a liquid inlet interface 1032a and a liquid return interface 1032b. The liquid inlet interface 1032a is used as a second fluid inlet, and the liquid return interface 1032b is used as a second fluid outlet. As shown in FIG. 13C, the second air outlet of the surface cooler 1032 according to the exemplary embodiments of the present disclosure is provided at the front end of the surface cooler 1032, and the front end of the surface cooler 1032 is fixed with two rows of exhaust fans, and each row of exhaust fans has four exhaust fans, which are used as an exhaust apparatus 106.

In order to simplify the complexity of pipeline arrangement, as shown in FIG. 11B, the first fluid inlet, the second fluid inlet, the first fluid outlet, and the second fluid outlet are all oriented towards the same first channel 101. In this case, for the same stacking structure, the first transmission pipeline and the second transmission pipeline may be arranged on the same side of the stacking structure. It should be understood that if there are a plurality of stacking structures, then each stacking structure can be provided with a set of transmission pipelines including a first transmission pipeline and a second transmission pipeline.

In a practical application, the first transmission pipeline and the second transmission pipeline according to the exemplary embodiments of the present disclosure may be embodied in the form of a liquid dispenser, and the liquid dispenser can be connected to the cooling water system of the computer room. The first transmission pipeline is equivalent to a main dispensing pipeline of the liquid dispenser, while the second transmission pipeline is equivalent to a main return pipeline of the liquid dispenser. As shown in FIG. 11A and FIG. 11B, the first transmission pipeline has a plurality of first branch 1051 that are connected to the first fluid inlet of each electronic device and the second fluid inlet of the surface cooler; the second transmission pipeline has a plurality of second branch 1052 that are connected to the first fluid outlet of each electronic device and the second fluid outlet of the surface cooler. In addition, a controllable valve, such as a solenoid valve, may be arranged at each first branch 1051 and/or the second branch 1052 to regulate the input or output flow volume of cooling fluid, and then indirectly adjust the cooling capacities of the cooling structure of the electronic device and the surface cooler.

As shown in FIG. 19, the surface cooler has a cooler housing 20 and a cooling pipeline 201 arranged in the cooler housing 20. The cooling pipeline 201 according to the exemplary embodiments of the present disclosure includes a plurality of main pipelines, for example two main pipelines 2011, 2012, and at least one connecting pipeline (also referred to as connecting channel) 2013, and each connecting pipeline 2013 communicates to two adjacent main pipelines 2011, 2012. One of the plurality of main pipelines, i.e., the main pipeline 2011 is communicated with the first transmission pipeline 105a and used as an input pipeline, and the other main pipeline, i.e., the main pipeline 2012 is communicated with the second transmission pipeline 105b and used as an output pipeline. The extending direction of main pipeline according to the exemplary embodiment of the present disclosure may be determined according to the actual situation. It should be understood that each main pipeline extends in the direction of in which the second air inlet and the second air outlet are distributed or along a height direction of the stacking structure. For example, each main pipeline extends along a height direction of the stacking structure.

When the second air inlet and the second air outlet are distributed in the positive direction of the first preset direction, in the transmission pipeline, each main pipeline is distributed along the positive direction of the first preset direction. In this case, along the height direction of the stacking structure, the cooling fluid in each main pipeline can uniformly cool the hot air entering the cooler housing, and the cooling capacity of the cooling fluid in each main pipeline decreases along the positive direction of the first preset direction. Because the second air inlet and the second air outlet are distributed along the positive direction of the first preset direction, so that along the positive direction of the first preset direction, the hot air entering the cooler housing keeps being cooled until it becomes cool air. Thus, even the cooling capacity of the cooling fluid in each main pipeline decreases along the positive direction of the first preset direction, the cold supply for cooling hot air can be guaranteed.

In order to increase the cooling rate of the cooling fluid to the hot air, each surface cooler further includes a heat sink assembly 202 located in the cooler housing 20, and the heat sink assembly 202 is provided on the cooling pipeline 201, as shown in FIG. 19. The cooling fluid in the cooling channel can transfer the cooling capacity to the heat sink assembly 202 through the cooling pipeline 201, and the heat sink assembly 202 has a large heat dissipation area, which can provide a large surface contact area for the hot air, so as to further improve the cooling efficiency of the surface cooler. For example, a heat sink assembly 202 in an exemplary embodiment of the present disclosure is a fin-like heat sink assembly or include a plurality of heat sinks arranged on the cooling pipeline.

Figure 14:
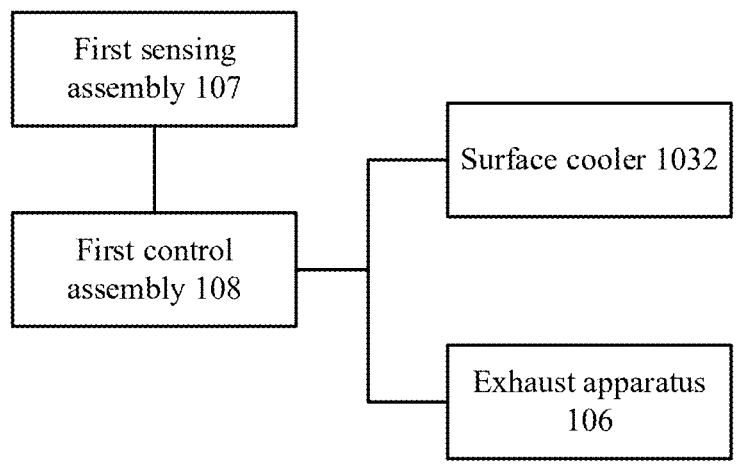
FIG. 14 and FIG. 15 show electrical schematic diagrams of automation controls of two electronic devices according to exemplary embodiments of the present disclosure.

FIG. 14 shows an electrical schematic diagram of an automation control according to an exemplary embodiment of the present disclosure. As shown in FIG. 14, the system for cooling a data center according to an exemplary embodiment of the present disclosure further includes a first sensing assembly 107 and a first control assembly communicated with the first sensing assembly 107. The first control assembly 108 further communicates with the exhaust apparatus 106 and the surface cooler 1032 respectively. The communication may be a conventional wired communication or a wireless communication.

Exemplarily, the first sensing assembly is used to acquire the temperature of at least one of the first air inlet, the second air inlet, the first air outlet, and the second air outlet (namely, at least one temperature of the first air inlet, the second air inlet, the first air outlet, and the second air outlet). The first control assembly is used to obtain the at least one temperature and increase the exhaust capacity of the exhaust apparatus and/or the cooling capacity of the surface cooler in response to that the at least one temperature matches a preset cooling condition. It should be understood that a temperature sensor or a humidity sensor may be arranged at at least one position of the first air inlet, the second air inlet, the first air outlet and the second air outlet.

In one example, when the at least one temperature includes: the temperature of the first air inlet, the temperature of the second air inlet, the temperature of the first air outlet, or the temperature of the second air outlet, the preset cooling condition is that the at least one temperature is lower than or equal to the preset temperature. The preset temperature may be a fixed value or a range of value.

When the at least one temperature includes the temperature of the first air inlet or the temperature of the second air outlet, it detects the temperature of the cool air entering the electronic device or the temperature of the cool air entering the second channel from the surface cooler. In this case, the preset temperature may be selected as 45° C. When the at least one temperature includes the temperature of the second air inlet or the temperature of the first air outlet, it detects the temperature of the hot air introduced from the electronic device into the first channel or the temperature of the hot air entering the surface cooler. In this case, the preset temperature may be selected as 65° C.

In another example, when the at least one temperature includes the temperature of the first air inlet and the temperature of the first air outlet, the preset cooling condition is that the temperature difference between the first air inlet and the first air outlet is lower than or equal to a preset temperature difference threshold. That is to say, when the temperature difference between the first air inlet and the first air outlet is lower than or equal to the preset temperature difference threshold, it means that the cool air provided by the surface cooler has not effectively cooled the heat-emission components inside the electronic device. Thus, the exhaust capacity of the exhaust apparatus needs to be increased, or the cooling capacity of the surface cooler needs to be increased, and the suction capacity of the suction apparatus can also be increased at the same time.

When the at least one temperature includes the temperature of the second air inlet and the temperature of the second air outlet, the preset cooling condition is that the temperature difference between the second air inlet and the second air outlet is lower than or equal to the preset temperature difference (such as 5° C.). That is to say, when the temperature difference between the temperature of the second air inlet and the temperature of the second air outlet is lower than the preset temperature difference, it means that the cooling capacity of the surface cooler is insufficient, so the exhaust capacity of the exhaust apparatus can be increased, or the cooling capacity of the surface cooler can be increased, and the suction capacity of the suction apparatus can be increased at the same time.

In one example, no matter what preset cooling conditions are adopted, the influence of ambient temperature is taken into account when increasing the exhaust capacity of the exhaust apparatus and/or increasing the cooling capacity of the surface cooler. For example, in the case of high ambient temperature in the summer, the temperature of cool air can rise up quickly after the surface cooler cools it down, so the ambient temperature factor is introduced into the regulation of exhaust capacity and/or cooling capacity. For example, for the same temperature or temperature difference, the exhaust capacity of the exhaust apparatus and/or the cooling capacity of the surface cooler should be increased in summer compared to that in winter, so as to balance the effects of ambient temperature.

In a practical application, a theoretical adjustment parameter can be determined based on at least one temperature, and a correction parameter can be used to correct the theoretical adjustment parameter(s).

When the theoretical adjustment parameter includes a theoretical adjustment parameter of the exhaust apparatus, the correction parameter includes an ambient temperature correction parameter for correcting the exhaust apparatus. When the theoretical adjustment parameter includes a theoretical adjustment parameter of the surface cooler, the correction parameter includes an ambient temperature correction parameter for correcting the surface cooler.

When the exhaust capacity of the exhaust apparatus is increased, taking the exhaust fan as an example, the speed of the driving motor of the exhaust fan can be increased to improve the exhaust capacity of the exhaust fan. When the cooling capacity of the surface cooler is increased, the flow rate of the cooling fluid at the second fluid inlet and the second fluid outlet of the surface cooler can be increased. For example, flow volume of the cooling fluid of a surface cooler can be increased by controlling the controllable valve of the first branch connected to the second fluid inlet and/or the controllable valve of the second branch connected to the second fluid outlet.

Taking the temperature of the second air outlet as an example, when the temperature of the second air outlet is greater than the preset temperature, a flow rate adjustment parameter of the cooling fluid corresponding to the temperature of the second air outlet can be looked up from the corresponding relationship between the temperature and the flow rate adjustment parameter of the cooling fluid. In the same way, taking the temperature of the second air inlet and the temperature of the second air outlet as an example, it can be set that when the temperature difference between the second air inlet and the second air outlet is greater than the preset temperature, the flow rate adjustment parameter of the cooling fluid can be looked up from the corresponding relationship between the temperature difference and the flow rate adjustment parameter of the cooling fluid.

Based on this, the influence of ambient temperature on the cooling fluid regulation parameter can be selectively considered, and the correction parameter associated with the ambient temperature is used to correct the cooling fluid adjustment parameter to offset the error caused by the ambient temperature, and the flow rate of the surface cooler can also be directly adjusted by the cooling fluid adjustment parameter.

Considering the high ambient temperature in summer, the surface cooler may not easily cool down the hot air, the cooling capacity of the surface cooler needs to be further increased. For example, when the ambient temperature is 30° C. to 35° C., a first correction parameter corresponding to cooling fluid regulation parameter exists; when the ambient temperature is greater than 35° C., the second correction parameter corresponding to the cooling fluid regulation parameter exists; and the ability of the second correction parameter to correct the cooling fluid regulation parameter is greater than the ability of the first correction parameter to correct the cooling fluid regulation parameter. Assuming that the ambient temperature is 38° C., after looking up the flow rate adjustment parameter of the cooling fluid, the second ambient temperature influence parameter is added to the flow rate adjustment parameter of the cooling fluid, so as to obtain the corrected cooling fluid flow rate adjustment parameter.

Considering the low ambient temperature in winter, the surface cooler may easily cool down the hot air, however, in this case, the cooling capacity of the surface cooler may be further reduced. For example, when the ambient temperature is -15° C. to -5° C., a third correction parameter corresponding to the cooling fluid regulation parameter exists; when the ambient temperature is greater than -5° C. and less than 5° C., the fourth correction parameter corresponding to the cooling fluid regulation parameter exists; and the ability of the third correction parameter to correct the cooling fluid regulation parameter is greater than the ability of the fourth correction parameter to correct the cooling fluid regulation parameter. Assuming that the ambient temperature is -8° C., after looking up the flow rate adjustment parameter of the cooling fluid, the fourth ambient temperature influence parameter is subtracted from the flow rate adjustment parameter of the cooling fluid to obtain the corrected flow rate adjustment parameter of the cooling fluid.

In addition, the first control assembly according to the exemplary embodiments of the present disclosure may further monitor the temperature of the main heat-emission components of the electronic device, such as the CPUs and the GPUs. When the temperature of any one of the main heat-emission components in an electronic device exceeds the temperature limit (such as 80° C. or above), the opening degree of each of the controllable valves of the first branch connected to the first fluid inlet and the second branch connected to the first fluid outlet of the electronic device can be increased, so as to rapidly cool down the electronic device. The cooling mode and the opening degree may be selected by referring to the relevant technology, which is not described again here.

Figure 15:
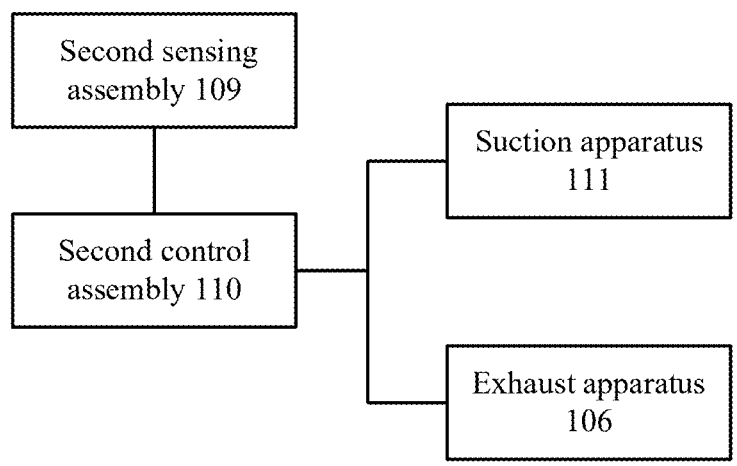

FIG. 15 shows another electrical schematic diagram of an automation control according to an exemplary embodiment of the present disclosure. As shown in FIG. 15, the system for cooling a data center according to the exemplary embodiments of the present disclosure further includes a second sensing assembly 109 and a second control assembly 110 communicating with the second sensing assembly 109. The second control assembly 110 further communicates with the exhaust apparatus 106 and the suction apparatus 111 respectively. The communication may be selected as a wired communication or a wireless communication, and can be selected according to the actual situation. It should be understood that the functions of the first control assembly and the second control assembly can be integrated together and used as a control platform for the data center cooling system to optimize the performance of the data center cooling system.

The second sensing assembly according to the exemplary embodiments of the present disclosure is used for acquiring pressure values of the first channel and the second channel. The second control assembly is used for obtaining the pressure values of the first channel and the second channel, and reducing the exhaust capacity of the exhaust apparatus and/or the suction capacity of the suction apparatus, in response that a pressure difference between the first channel and the second channel is greater than or equal to a preset pressure difference. The preset pressure difference can be 10% of one standard atmospheric pressure, or lower than 10% of one standard atmospheric pressure, so that the pressure difference between the first channel and the second channel is as close as possible to one standard atmospheric pressure. When the stacking structure is located in an enclosed housing and the pressure difference is controlled within the above range, the inside of the enclosed housing is not prone to leakage, thereby reducing the possibility of heat exchange with the external environment.

In a practical application, the second sensing assembly may include a plurality of pressure sensors and the plurality of pressure sensors are divided into two groups, which are arranged in the first channel and the second channel, respectively. The pressure value acquired by each pressure sensor located in the first channel is the pressure value of the first channel, and the pressure value collected by each pressure sensor located in the second channel is the pressure value of the second channel.

When the exhaust apparatus includes an exhaust fan and the suction apparatus includes a suction fan, the pressure difference between the first channel and the second channel can be controlled by adjusting the rotation speed of the motor of the exhaust fan and/or the suction fan. For example, it is possible to establish a corresponding relationship between the pressure difference and the rotation speed of the motor of the exhaust fan and/or suction fan. When the pressure difference between the first channel and the second channel is greater than or equal to the preset pressure difference, the target rotation speed of the motor of the exhaust fan and/or suction fan can be looked up from the corresponding relationship based on the pressure difference, and then the rotation speed of the motor of the exhaust fan and/or suction fan can be controlled based on the target rotation speed of the motor, so that the pressure difference between the first channel and the second channel is controllable.

The exemplary embodiments of the present disclosure further provide a data center computer room, which may include a system for cooling data center according to the exemplary embodiments of the present disclosure, with similar beneficial effects that may refer to the preceding paragraphs, which are not described again herein.

In an optional implementation, the data center computer room according to the exemplary embodiments of the present disclosure includes a plurality of computer cabinets, which can be arranged according to actual needs. One or more of the plurality of computer cabinets may be the system for cooling data center provided in any one of the embodiments described above.

In an optional implementation, the data center computer room according to the exemplary embodiments of the present disclosure includes a plurality of stacking structures, the data center computer room is enclosed, and the plurality of stacking structures are distributed in the manner or in the principle same as shown in FIG. 12.

In an optional implementation, the data center computer room according to the exemplary embodiments of the present disclosure comprises one or more computer cabinets and one or more stacking structures, and the structure of the computer cabinet may be a conventional structure, or may be the system for cooling data center provided in any one of the embodiments described above. The stacking structure may be the stacking structure in any one of the embodiments described above, and the principle of cooling the electronic device contained in the stacking structure can be referred to those described in the description above.

Figure 16:
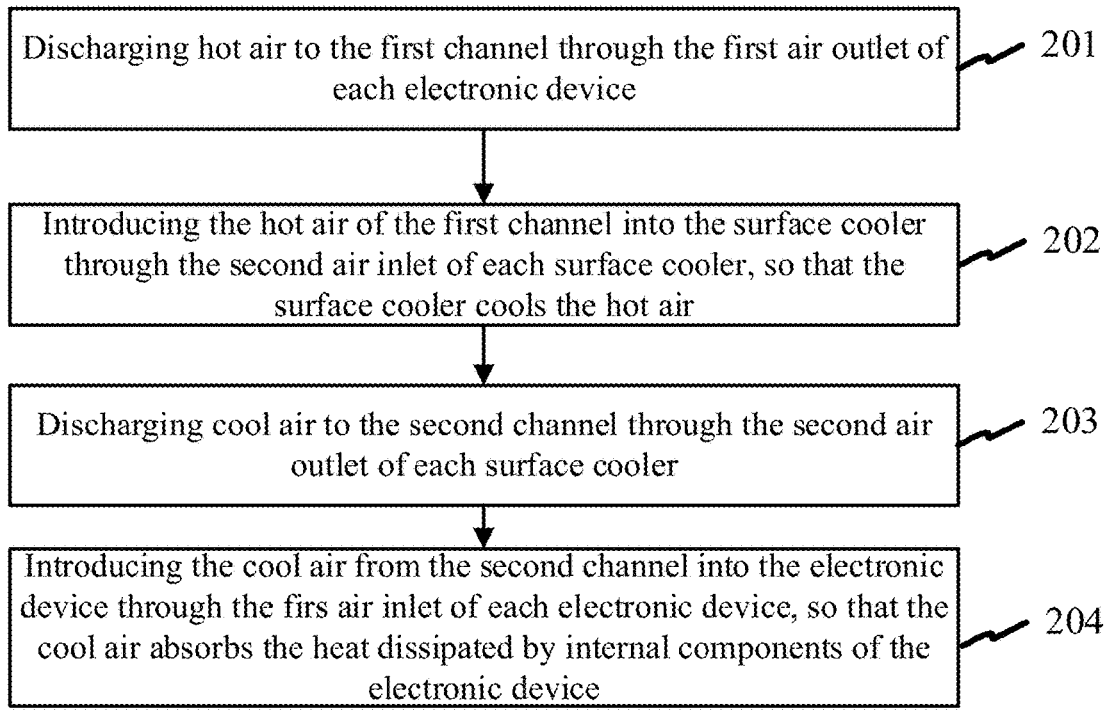
FIG. 16 shows a method flowchart of each cooling cycle according to an exemplary embodiment of the present disclosure.

The exemplary embodiments of the present disclosure further disclose a method for cooling a data center that may be applied to the data center cooling system according to the exemplary embodiments of the present disclosure. The cooling of the data center has a plurality of cooling cycles. FIG. 16 shows a method flowchart of each cooling cycle according to an exemplary embodiment of the present disclosure. As shown in FIG. 16, each cooling cycle includes:

Step 201: discharging hot air to the first channel through the first air outlet of each electronic device;

Step 202: introducing the hot air of the first channel into the surface cooler through the second air inlet of each surface cooler, so that the surface cooler cools the hot air;

Step 203: discharging cool air to the second channel through the second air outlet of each surface cooler; and step 204: introducing the cool air from the second channel into the electronic device through the first air inlet of each electronic device, so that the cool air absorbs the heat dissipated by internal components of the electronic device.

Figure 17:
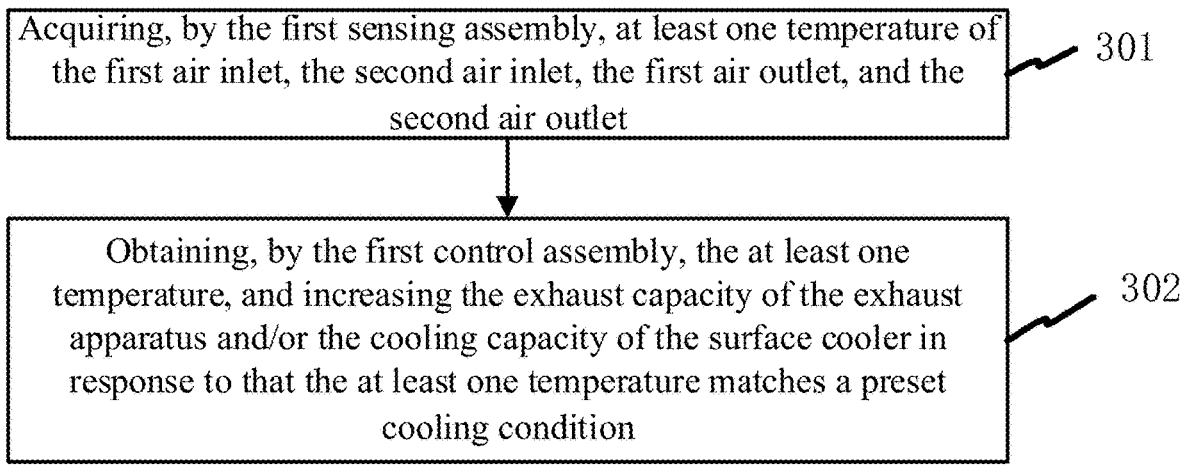
FIG. 17 shows a cooperation process flowchart of a first control assembly and a first sensing assembly according to an exemplary embodiment of the present disclosure.

In an optional implementation, the data center cooling method according to the exemplary embodiments of the present disclosure is applied to the data center cooling system that includes a first control assembly and a first sensing assembly. FIG. 17 shows a cooperation process flowchart of a first control assembly and a first sensing assembly according to an exemplary embodiment of the present disclosure. As shown in FIG. 17, each cooling cycle further includes:

Step 301: acquiring, by a first sensing assembly, a temperature of at least one of the first air inlet, the second air inlet, the first air outlet, and the second air outlet (namely, at least one temperature of the first air inlet, the second air inlet, the first air outlet, and the second air outlet);

Step 302: obtaining, by a first control assembly, the at least one temperature and increasing the exhaust capacity of the exhaust apparatus and/or the cooling capacity of the surface cooler in response to that the at least one temperature matches a preset cooling condition.

Exemplarily, the at least one temperature includes: the temperature of the first air inlet, the temperature of the second air inlet, the temperature of the first air outlet, or the temperature of the second air outlet; the preset cooling condition is that the at least one temperature is lower than or equal to a preset temperature.

When the at least one temperature includes the temperature of the first air inlet and the temperature of the first air outlet, the preset cooling condition is that the temperature difference between the first air inlet and the first air outlet is lower than or equal to a preset temperature difference.

When the at least one temperature includes the temperature of the second air inlet and the temperature of the second air outlet, the preset cooling condition is that the temperature difference between the second air inlet and the second air outlet is lower than or equal to a preset temperature difference.

Exemplarily, the increasing the exhaust capacity of the exhaust apparatus and/or the cooling capacity of the surface cooler includes: determining a theoretical adjustment parameter based on the at least one temperature and correcting the theoretical adjustment parameter by using a correction parameter.

When the theoretical adjustment parameter includes the theoretical adjustment parameter of the exhaust apparatus, the correction parameter includes an ambient temperature correction parameter for correcting the exhaust apparatus; and/or when the theoretical adjustment parameter includes the theoretical adjustment parameter of the surface cooler, the correction parameter includes an ambient temperature correction parameter of the surface cooler.

In an optional implementation, the data center cooling method according to the exemplary embodiments of the present disclosure is applied to the data center cooling system. The data center cooling system has a second sensing module and a second control assembly. FIG. 18 shows a cooperation process flowchart of a second control assembly and a second sensing assembly according to an exemplary embodiment of the present disclosure. As shown in FIG. 18, each of the cooling cycles further includes:

Step 401: acquiring, by the second sensing assembly, a pressure difference of the first channel and the second channel;

Step 402: obtaining, by the second control assembly, the pressure values of the first channel and the second channel, and reducing the exhaust capacity of the exhaust apparatus and/or the suction capacity of the suction apparatus in response to that a pressure difference is greater than or equal to a preset pressure difference.

The data center cooling method according to the exemplary embodiments of the present disclosure may refer to the beneficial effects of the data center cooling system of the exemplary embodiment of the present disclosure, which are not described again here.

In the description of the above embodiments, specific features, structures, materials, or features may be combined in an appropriate manner in any one or more embodiments or examples.

The above description only provides specific embodiments of the present disclosure, and the protection scope of the present disclosure is not limited thereto. Any person skilled in the art may easily make various changes or replacements within the technical scope of the present disclosure herein, which shall fall within the protection scope of the present disclosure. Thus, the protection scope of the present disclosure shall be defined only by the claims.

The invention claimed is:

1. A system for cooling a data center, wherein the system has a first channel and a second channel and comprises: a stacking structure located between the first channel and the second channel;

wherein the stacking structure comprises at least one electronic device and at least one surface cooler stacked with each other, each electronic device has a first air inlet and a first air outlet, each surface cooler has a second air inlet and a second air outlet, the first air outlet and the second air inlet are both oriented towards one side of the first channel, and the first air inlet and the second air outlet are both oriented towards one side of the second channel;

wherein the system further comprises a first sensing assembly and a first control assembly communicating with the first sensing assembly, the first control assembly communicates with each surface cooler and an exhaust apparatus arranged at an air outlet of a corresponding surface cooler;

wherein the first sensing assembly is configured to acquire at least one temperature of the first air inlet, the second air inlet, the first air outlet, or the second air outlet; and wherein the first control assembly is configured to obtain the at least one temperature, and increase at least one of exhaust capacity of the exhaust apparatus or cooling capacity of the corresponding surface cooler in response to the at least one temperature matching a preset cooling condition.

2. The system for cooling a data center according to claim 1, further comprising: a first transmission pipeline and a second transmission pipeline, each surface cooler has a cooler housing and a cooling pipeline arranged in the cooler housing, the second air inlet and the second air outlet are provided on the cooler housing, and the cooling pipeline is communicated with the first transmission pipeline and the second transmission pipeline, respectively.

3. The system for cooling a data center according to claim 2, wherein the cooling pipeline comprises a plurality of main pipelines and at least one connecting channel, each connecting channel is connected to two adjacent main pipelines, one of the main pipelines is communicated with the first transmission pipeline, and the other main pipeline is communicated with the second transmission pipeline.

4. The system for cooling a data center according to claim 3, wherein each surface cooler further has a heat sink assembly provided in the cooler housing, and the heat sink assembly is provided on the cooling pipeline.

5. The system for cooling a data center according to claim 3, wherein each electronic device has a cooling structure, the cooling structure has a cooling chamber, and the cooling chamber is communicated with the first transmission pipeline and the second transmission pipeline, respectively.

6. The system for cooling a data center according to claim 2, wherein each surface cooler further has a heat sink assembly provided in the cooler housing, and the heat sink assembly is provided on the cooling pipeline.

7. The system for cooling a data center according to claim 6, wherein each electronic device has a cooling structure, the cooling structure has a cooling chamber, and the cooling chamber is communicated with the first transmission pipeline and the second transmission pipeline, respectively.

8. The system for cooling a data center according to claim 2, wherein each electronic device has a cooling structure, the cooling structure has a cooling chamber, and the cooling chamber is communicated with the first transmission pipeline and the second transmission pipeline, respectively.

9. The system for cooling a data center according to claim 8, wherein the cooling structure has a first fluid inlet and a first fluid outlet communicated with the cooling chamber, and the cooler housing has a second fluid inlet and a second fluid outlet that are communicated with the cooling pipeline, respectively;

the first fluid inlet and the second fluid inlet are all communicated with the first transmission pipeline, the first fluid outlet and the second fluid outlet are communicated with the second transmission pipeline, and the first fluid inlet, the second fluid inlet, the first fluid outlet, and the second fluid outlet are all oriented towards the same first channel.

10. The system for cooling a data center according to claim 1, further comprising an enclosed housing, wherein at least one group of stacking structures are located in the enclosed housing, the first channel and the second channel are alternately distributed in the enclosed housing along a first preset direction; each group of the stacking structures are located between the adjacent first channel and the second channel, and the same group of stacking structures comprises at least one stacking structure.

11. The system for cooling a data center according to claim 1, wherein each electronic device is a liquid-cooling electronic device, and each surface cooler is a liquid-cooling surface cooler.

12. The system for cooling a data center according to claim 1, wherein the at least one electronic device is provided with a suction apparatus which is inside the at least one electronic device.

13. The system for cooling a data center according to claim 12, further comprising a second sensing assembly and a second control assembly communicating with the second sensing assembly, and the second control assembly communicates with the exhaust apparatus and the corresponding surface cooler respectively;

the second sensing assembly is configured to acquire pressure values of the first channel and the second channel, the second control assembly is configured to obtain the pressure values of the first channel and the second channel, and reduce at least one of the exhaust capacity of the exhaust apparatus or suction capacity of the suction apparatus when a pressure difference between the first channel and the second channel is greater than or equal to a preset pressure difference.

14. A data center computer room, comprising a system for cooling a data center, wherein the system has a first channel and a second channel and comprises: a stacking structure located between the first channel and the second channel;

wherein the stacking structure comprises at least one electronic device and at least one surface cooler stacked with each other, each electronic device has a first air inlet and a first air outlet, each surface cooler has a second air inlet and a second air outlet, the first air outlet and the second air inlet are both oriented towards one side of the first channel, and the first air inlet and the second air outlet are both oriented towards one side of the second channel;

wherein the system further comprises a first sensing assembly and a first control assembly communicating with the first sensing assembly, the first control assembly communicates with each surface cooler and an exhaust apparatus arranged at an air outlet of a corresponding surface cooler;

wherein the first sensing assembly is configured to acquire at least one temperature of the first air inlet, the second air inlet, the first air outlet, and the second air outlet; and wherein the first control assembly is configured to obtain the at least one temperature, and increase at least one of exhaust capacity of the exhaust apparatus or cooling capacity of the corresponding surface cooler in response to the at least one temperature matching a preset cooling condition.

15. A method for cooling a data center applied to a system for cooling a data center, wherein the system has a first channel and a second channel and comprises: a stacking structure located between the first channel and the second channel;

wherein the stacking structure comprises at least one electronic device and at least one surface cooler stacked with each other, each electronic device has a first air inlet and a first air outlet, each surface cooler has a second air inlet and a second air outlet, the first air outlet and the second air inlet are both oriented towards one side of the first channel, and the first air inlet and the second air outlet are both oriented towards one side of the second channel;

wherein the system further comprises a first sensing assembly and a first control assembly communicating with the first sensing assembly, the first control assembly communicates with each surface cooler and an exhaust apparatus arranged at an air outlet of a corresponding surface cooler;

wherein the first sensing assembly is configured to acquire at least one temperature of the first air inlet, the second air inlet, the first air outlet, and the second air outlet; and wherein the first control assembly is configured to obtain the at least one temperature, and increase at least one of exhaust capacity of the exhaust apparatus or cooling capacity of the corresponding surface cooler in response to the at least one temperature matching a preset cooling condition;

wherein the method for cooling a data center has a plurality of cooling cycles, each of which comprises:

discharging hot air to the first channel through a first air outlet of each electronic device;

introducing the hot air of the first channel into the surface cooler through a second air inlet of each surface cooler, so that the surface cooler cools the hot air;

discharging cool air to the second channel through a second air outlet of each surface cooler;

introducing the cool air from the second channel into the electronic device through a first air inlet of each electronic device, so that the cool air absorbs the heat dissipated by internal components of the electronic device.

16. The method for cooling a data center according to claim 15, wherein each cooling cycle further comprises:

acquiring, by the first sensing assembly, the at least one temperature of the first air inlet, the second air inlet, the first air outlet, or the second air outlet;

obtaining, by the first control assembly, the at least one temperature and increasing the at least one of exhaust capacity of the exhaust apparatus or cooling capacity of the corresponding surface cooler in response to the at least one temperature matching the preset cooling condition.

17. The method for cooling a data center according to claim 16, wherein:

the at least one temperature comprises: a temperature of the first air inlet, a temperature of the second air inlet, a temperature of the first air outlet, or a temperature of the second air outlet, the preset cooling condition is that the at least one temperature is lower than or equal to a preset temperature; or the at least one temperature comprises the temperature of the first air inlet and the temperature of the first air outlet, the preset cooling condition is that a temperature difference between the first air inlet and the first air outlet is lower than or equal to a preset temperature difference; or the at least one temperature comprises the temperature of the second air inlet and the temperature of the second air outlet, the preset cooling condition is that a temperature difference between the second air inlet and the second air outlet is lower than or equal to a preset temperature difference.

18. The method for cooling a data center according to claim 16, wherein increasing at least one of the exhaust capacity of the exhaust apparatus or the cooling capacity of the corresponding surface cooler comprises:

based on the at least one temperature, determining a theoretical adjustment parameter, and using a correction parameter to correct the theoretical adjustment parameter; wherein:

the theoretical adjustment parameter comprises a theoretical adjustment parameter of the exhaust apparatus, the correction parameter comprises an ambient temperature correction parameter for correcting the exhaust apparatus; or the theoretical adjustment parameter comprises a theoretical adjustment parameter of the surface cooler, the correction parameter comprises an ambient temperature correction parameter of the surface cooler.

19. The method for cooling a data center according to claim 15, wherein each cooling cycle further comprises:

acquiring, by a second sensing assembly, pressure values of the first channel and the second channel;

obtaining, by a second control assembly, the pressure values of the first channel and the second channel, and reducing at least one of the exhaust capacity of the exhaust apparatus or suction capacity of a suction apparatus in response to that a pressure difference between the first channel and the second channel is greater than or equal to a preset pressure difference.

* * * * *